United States Patent
Braun

(10) Patent No.: US 10,892,761 B1
(45) Date of Patent: Jan. 12, 2021

(54) INVERTING WPL GATES WITH EDGE-TRIGGERED READOUT

(71) Applicant: Alexander Louis Braun, Baltimore, MD (US)

(72) Inventor: Alexander Louis Braun, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/822,707

(22) Filed: Mar. 18, 2020

(51) Int. Cl.
| | |
|---|---|
| *H03K 19/195* | (2006.01) |
| *H03K 19/20* | (2006.01) |
| *H03K 3/38* | (2006.01) |
| *H03K 19/21* | (2006.01) |
| *G06N 10/00* | (2019.01) |

(52) U.S. Cl.
CPC ............. *H03K 19/195* (2013.01); *H03K 3/38* (2013.01); *H03K 19/20* (2013.01); *H03K 19/21* (2013.01); *G06N 10/00* (2019.01)

(58) Field of Classification Search
CPC ........ H03K 19/195; H03K 3/38; H03K 19/21; H03K 19/20; G06N 10/00
See application file for complete search history.

(56) References Cited

U.S. PATENT DOCUMENTS

| | | | |
|---|---|---|---|
| 7,724,020 B2 | 5/2010 | Herr | |
| 7,786,748 B1 | 8/2010 | Herr | |
| 10,147,484 B1* | 12/2018 | Braun | ................. H03K 19/195 |
| 10,320,394 B1* | 6/2019 | Powell | ............... H03K 19/1952 |
| 10,374,610 B1 | 8/2019 | Braun | |
| 10,389,361 B1* | 8/2019 | Powell, III | ............. G06N 10/00 |
| 2018/0226974 A1* | 8/2018 | Harms | ................. H03K 19/195 |
| 2020/0044632 A1* | 2/2020 | Powell, III | ............... H03K 3/38 |

* cited by examiner

*Primary Examiner* — Daniel D Chang
(74) *Attorney, Agent, or Firm* — Tarolli, Sundheim, Covell & Tummino LLP

(57) ABSTRACT

A reciprocal quantum logic (RQL) wave-pipeline logic (WPL) inverting gate includes a Josephson junction-based comparator that corrects a design weakness present in other RQL WPL inverting gates that can lead to the propagation of glitches under certain timing conditions. With selective placement of pulse generators at the inputs, the RQL WPL inverting gate can be used to construct A AND (B XOR C) gates, XOR gates, NOT gates, and A-AND-NOT-B gates.

20 Claims, 40 Drawing Sheets

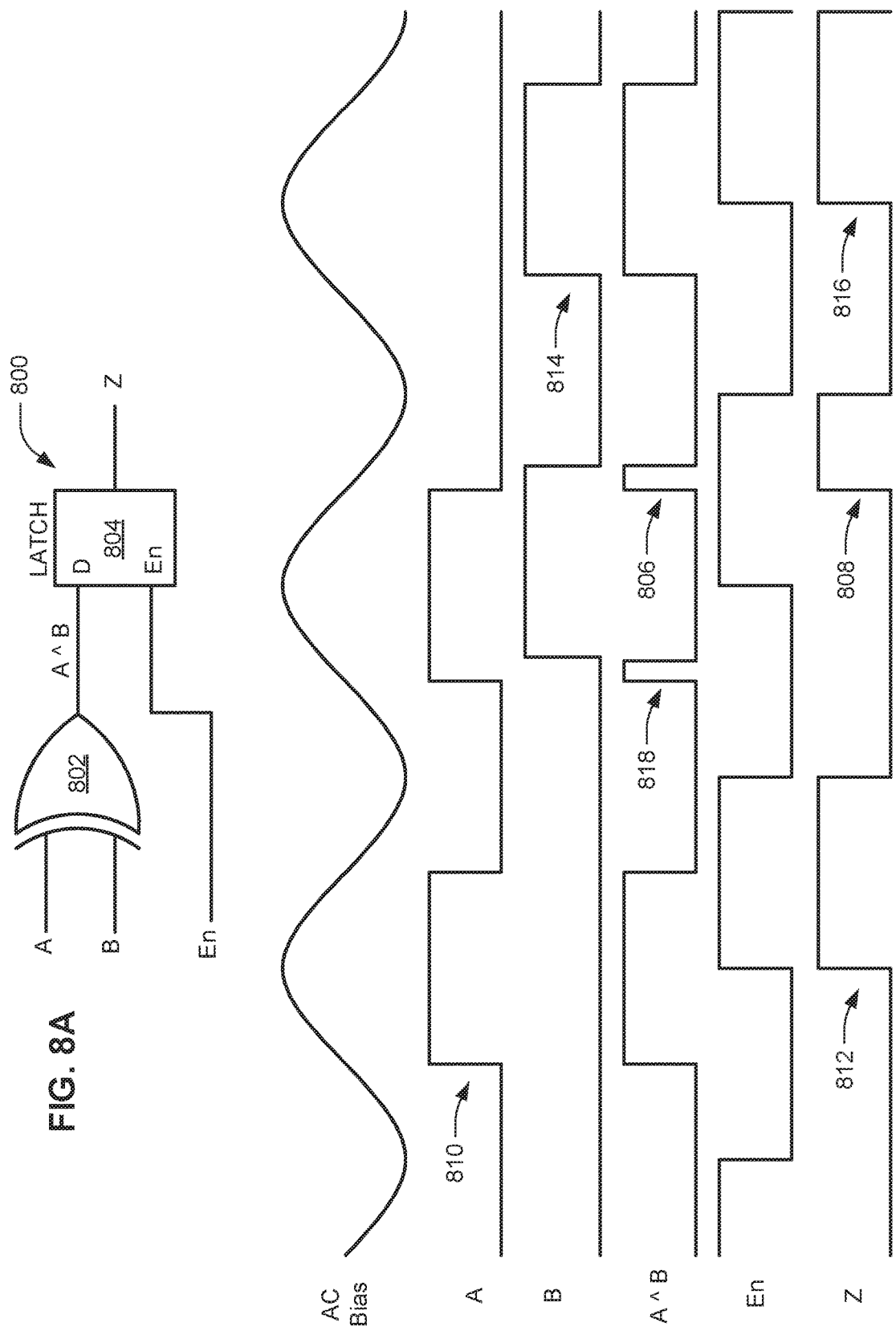

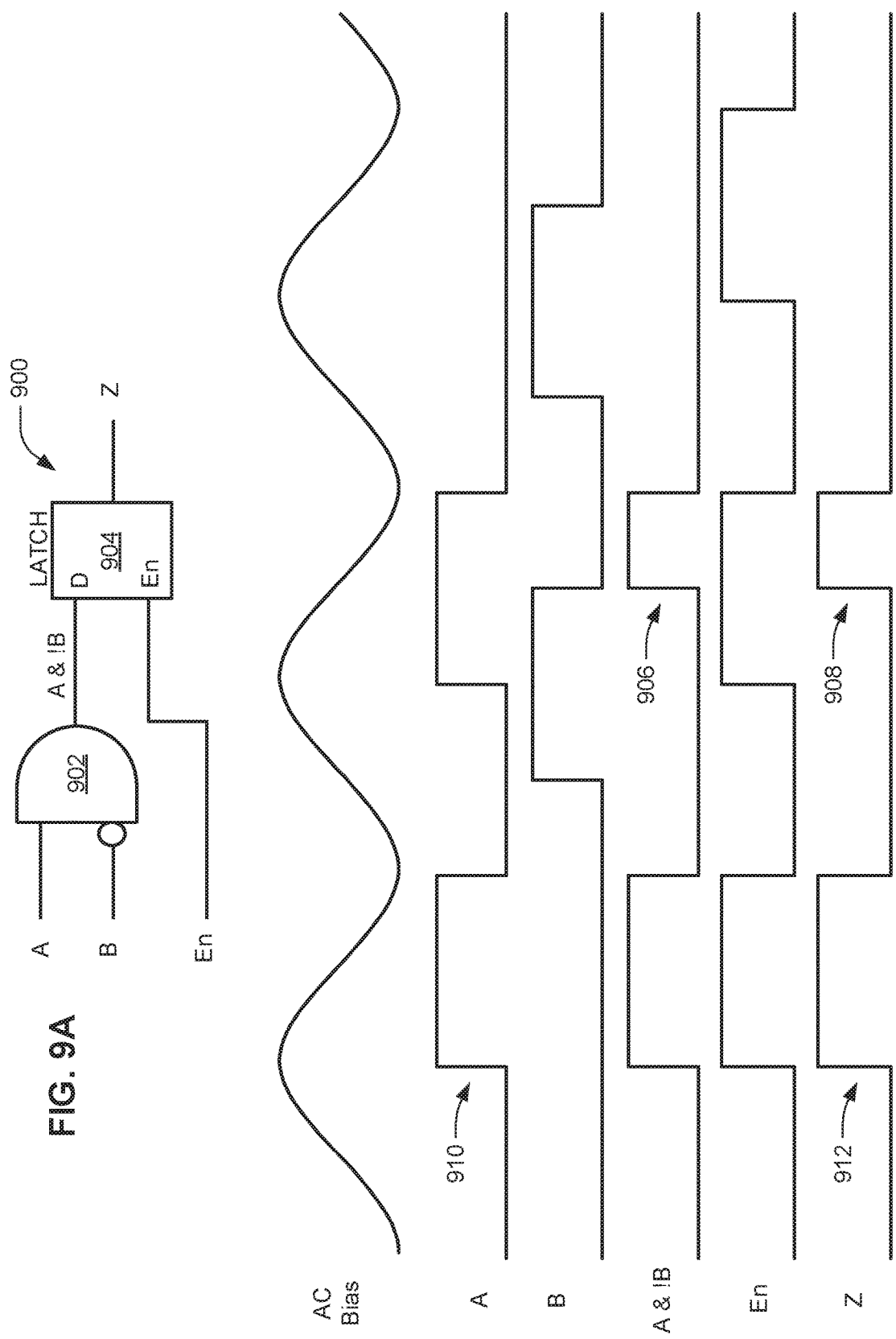

US 10,892,761 B1

INVERTING WPL GATES WITH EDGE-TRIGGERED READOUT

TECHNICAL FIELD

The present invention relates generally to quantum and classical digital superconducting circuits, particularly to reciprocal quantum logic (RQL) circuits, and specifically to inverting wave pipeline logic (WPL) gates with edge-triggered readout.

BACKGROUND

In the field of digital logic, extensive use is made of well-known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

Reciprocal quantum logic (RQL) circuits represent one family of superconducting logic. RQL circuits have been made in different data encodings. The traditional data encoding has come to be called wave-pipeline logic (WPL), to distinguish it from the newer phase-mode logic (PML) encoding.

SUMMARY

One example includes a reciprocal quantum logic (RQL) wave-pipeline logic (WPL) inverting gate. The gate includes a first stage having an XOR-enforcing Josephson junction. The first stage is configured to receive at least two data input signals each as single flux quantum (SFQ) pulses and to process the data input signals with the XOR-enforcing Josephson junction to provide an intermediate signal. The gate also includes a second stage having a comparator configured to receive the intermediate signal and a clocking input signal as SFQ pulses. The second stage is configured to propagate the intermediate signal to an output of the RQL WPL inverting gate at a time of an edge of the clocking input signal.

Another example includes a method of operating an RQL WPL inverting gate. A first data input SFQ pulse signal is asserted on a first data input coupled to a first stage of an RQL WPL inverting gate. Additionally or alternatively, a second data input SFQ pulse signal is asserted on a second data input that is also coupled to the first stage of the RQL WPL inverting gate. A logical clocking input SFQ pulse signal is provided to a second stage of the RQL WPL inverting gate. The asserted first or second data input SFQ pulse signal is propagated to an output of the RQL WPL inverting gate based on only one of the first or second data input SFQ pulse signals being asserted in an RQL AC clock cycle at the time of an edge of the logical clocking input SFQ pulse signal.

Yet another example includes an RQL WPL circuit. The circuit has first and second data signal inputs to a first node. The circuit further has a logical clock signal input to a second node. The circuit further has a first Josephson junction (JJ). The first terminal of the first JJ is coupled to the first node and a second terminal of the first JJ is coupled to a third node. The first JJ is configured to provide exclusive-OR functionality with respect to data input signals provided on the first and second data signal inputs. The circuit further has a second JJ. A first terminal of the second JJ is coupled to the third node and a second terminal of the second JJ is coupled to ground. The circuit further has a third JJ. A first terminal of the third JJ is coupled to the second node and a second terminal of the third JJ is coupled to the third node. The second and third JJs form a comparator. The circuit further has a ground inductor. A first terminal of the ground inductor is coupled to the third node and a second terminal of the ground inductor is coupled to ground. The circuit further has an output.

BRIEF DESCRIPTION OF THE DRAWINGS

FIG. 8A is a block diagram of an RQL WPL exclusive-OR (XOR) gate having a race-condition design weakness.

FIG. 8B is an example timing diagram for the gate of FIG. 8A.

FIG. 9A is a block diagram of an RQL WPL A AND NOT B gate having a race-condition design weakness.

FIG. 9B is an example timing diagram for the gate of FIG. 9A.

DETAILED DESCRIPTION

In reciprocal quantum logic (RQL) circuits based on wave-pipeline logic (WPL), signals are only asserted for one half of a clock cycle due to the return-to-zero (RZ) data encoding. As a result, when two signals converge at a logic gate, they must in some instances arrive essentially simultaneously, or otherwise can give rise to a race condition. Circuits described in the present application provide inverting logic cells for use in WPL design with improved operating margins and which rectify a design weakness that gives rise to a race condition issue in other WPL inverting gate designs. As used herein, "inverting gate" is not limited to a NOT gate, refers to any logic gate circuit that effectively inverts an input signal in processing the input signal to provide an output signal. Examples of inverting gates include XOR gates, NOT gates, and A-AND-NOT-B gates.

Figure 1A:
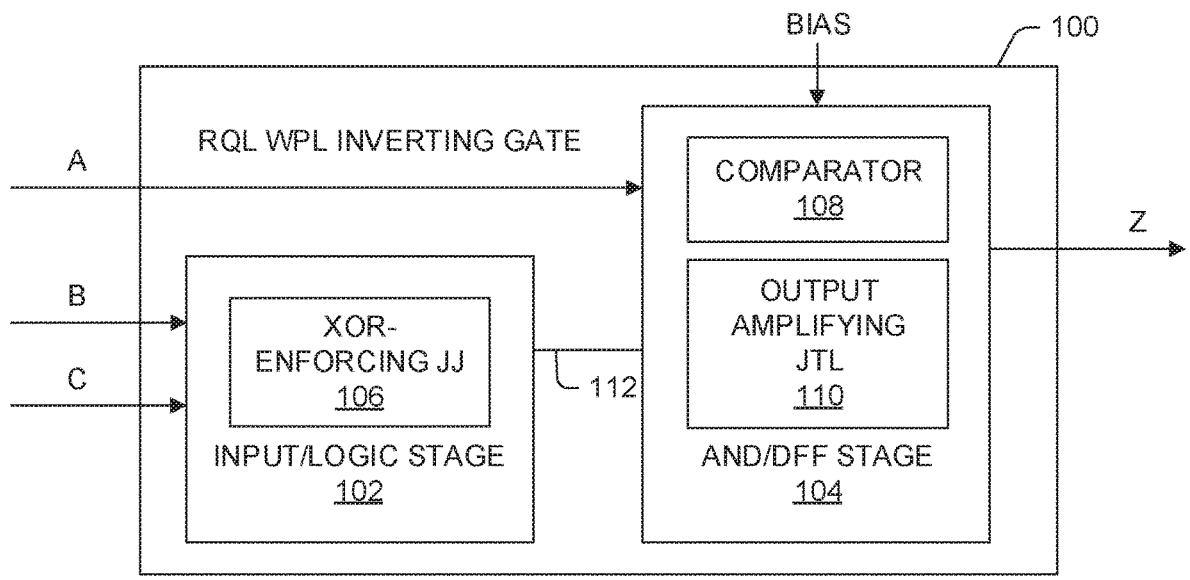
FIG. 1A is a block diagram of an example reciprocal quantum logic (RQL) wave-pipeline logic (WPL) inverting gate.
Figure 1B:
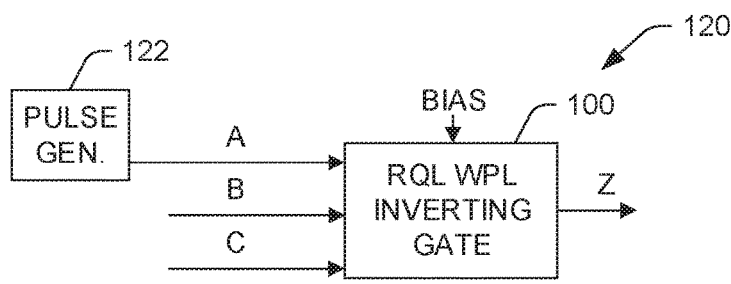
FIG. 1B is a block diagram of the RQL WPL gate of FIG. 1A configured as an exclusive-OR (XOR) gate.
Figure 1C:
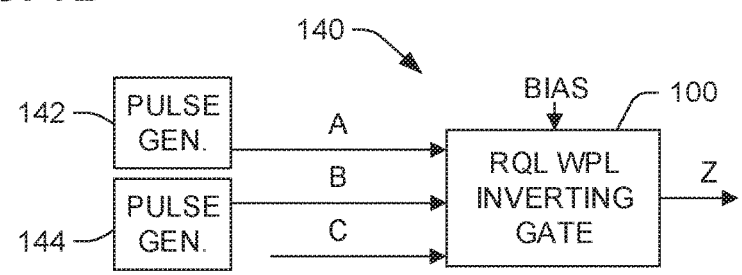
FIG. 1C is a block diagram of the RQL WPL gate of FIG. 1A configured as a NOT gate.
Figure 1D:
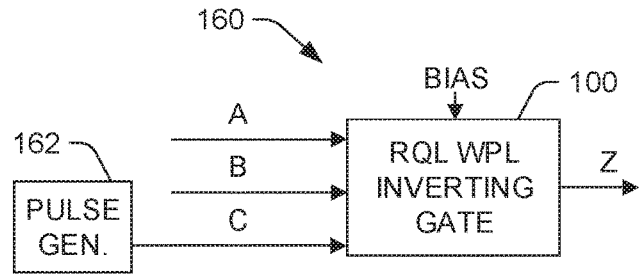
FIG. 1D is a block diagram of the RQL WPL gate of FIG. 1A configured as an A-AND-NOT-B gate.

FIG. 1A is an example block diagram of a superconducting RQL WPL inverting gate 100 having at least one input and at least one output. As illustrated, gate 100 is shown as having three inputs A, B, and C, but gate 100 can have more or fewer inputs than three. Similarly, gate 100 is shown as having one output Z, but gate 100 can have more outputs than one. Gate 100 is organized into at least two logical stages, a first stage 102, referred to as an input/logic stage, and a second stage 104, referred to as an AND/DFF stage, in that it fulfills a logic function similar to an AND gate or a D flip-flop. The input/logic stage 102 receives at least two input signals B, C as single flux quantum (SFQ) pulses and processes the inputs and/or logically combines the multiple inputs to produce an intermediate logical signal 112 that is sent to the AND/DFF stage 104. AND/DFF stage 104 receives at least one input signal A as single SFQ pulses. Although not illustrated, input/logic stage 102 can likewise receive input from an AC bias input. Input A can, for example, be a logical clock input, which should not be confused with an RQL AC clock that may be used to provide reciprocal clock signals in an RQL system. Inputs B and C can, for example, be data inputs. As illustrated in FIGS. 1B, 1C, and 1D, any of the inputs A, B, or C can be connected ("tied off") to a pulse generator to permit gate 100 to yield different logical functions.

Input/logic stage 102 includes an XOR-enforcing Josephson junction (JJ) 106 configured to output a logical XOR of one or more of the inputs (e.g., inputs B or C) with one or more of the other inputs. An XOR-enforcing Josephson junction is a Josephson junction configured, by its placement in a circuit and its interaction with other circuit components, to pass an SFQ pulse that arrives from only one of multiple inputs within a single AC clock cycle but to reject all SFQ pulses that arrive from multiple of the inputs within a single AC clock cycle, for example, by being placed in series with multiple converging inputs. AND/DFF stage 104 includes a comparator 108. Comparator 108 can, for example, be made of two Josephson junctions coupled to one another at a joining node, and can be configured to compare intermediate logical signal 112 with input A or an internally generated RZ SFQ clock that can be based, for example, on the AC waveform supplied by bias signal BIAS. AND/DFF stage 104 can then base a signal produced at output Z upon such comparison. AND/DFF stage can also include an output amplifying Josephson transmission line (JTL) 110 that can, in effect, amplify the output signal so that it can drive circuitry attached to the output Z of the gate 100.

SFQ pulses arriving at the inputs A, B, C can consist of alternating positive and negative SFQ pulses consistent with RQL WPL data encoding. Gate 100 can be configured in a larger system that can enforce various constraints on the inputs. For example, gate 100 can be configured in a larger system such that only one positive-negative reciprocal pulse pair will arrive at any given data or logical clock input within any given AC clock cycle. As another example, gate 100 can be configured in a larger system such that data inputs B, C to the input/logic stage 102 always arrive before any logical clock input A to the AND/DFF stage 104 within any given AC clock cycle.

Inverting gate 100 can, for example, be configured as a clocked XOR gate, an XOR gate, a NOT gate, or an A-AND-NOT-B gate. For example, as a clocked XOR gate, gate 100 can be configured to include, as shown in FIG. 1A, two data inputs B and C to input/logic stage 102 to provide input signals as SFQ pulses, and a logical clock input A to AND/DFF stage 104 to provide a logical clock signal as SFQ pulses. Input/logic stage can XOR the two input signals B and C to provide intermediate signal 112 of B^C ("B XOR C") which is then sent on to output Z on an edge of logical clock signal A by the flip-flop function of AND/DFF stage 104. In such a configuration, the output Z with every clock cycle of the RQL AC clock is A & (B^C) ("A AND (B XOR C)").

FIG. 1B shows an XOR gate 120 that includes gate 100 from FIG. 1A with its input A connected to a pulse generator 122. Pulse generator 122 generates a logical clock signal as a series of RZ-encoded logical "1"s, e.g., from an AC bias input (not shown), which can be the same AC bias input BIAS provided to gate 100. Pulse generator 122 can consist, for example, of a Josephson junction configured to provide an SFQ pulse pair with every cycle of the AC clock, and can further include a JTL to transmit the pulse pair to an input of the gate 100 with improved operating margins. In such a configuration as shown in FIG. 1B, the output Z with every clock cycle of the RQL AC clock is B^C ("B XOR C").

FIG. 1C shows a NOT gate 140 that includes gate 100 from FIG. 1A with its input A to its AND/DFF stage 104 and one of its inputs to its input/logic stage 102 (illustrated in FIG. 1C as being input B, but in other examples, input C can be used) connected to respective pulse generators 142, 144 (which can be structurally and functionally the same as described above with respect to pulse generator 122). This configuration leaves only one data input (as illustrated, input C, but in other examples, this can be input B) remaining to be externally supplied. In such a configuration, the output Z with every clock cycle of the RQL AC clock would be the logical inversion of the remaining externally supplied input, !C ("NOT C").

FIG. 1D shows an A-AND-NOT-B gate 160 that includes gate 100 from FIG. 1A with its inputs C connected to pulse generator 162 (which, again, can be structurally and functionally the same as described above with respect to pulse generator 122). (Although the tied-off input is illustrated in FIG. 1D as being input C, in other examples, input B can be used as the tied-off input.) In such a configuration, the output Z with every clock cycle of the RQL AC clock is the logical AND of input signal A with the logical inversion of input B, A & !B ("A-AND-NOT-B").

Figure 2:
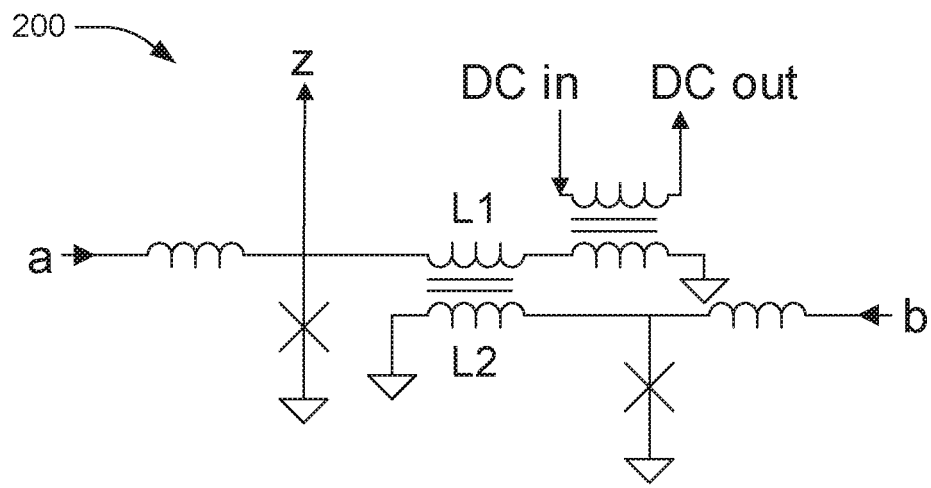
FIGS. 2-7 are schematic diagrams of RQL WPL inverting gate circuits having a race-condition design weakness.

FIGS. 2 through 6 illustrate circuit designs implementing inverting functions in wave-pipeline reciprocal quantum logic, all having a design weakness that can allow glitches to propagate to the circuit output, as demonstrated by FIGS. 8-9. FIG. 2 shows a gate circuit design 200 that includes large chip-area-consumptive transformers (e.g., L1/L2). Circuit 200 is configured to receive SFQ pulses as input signals at inputs a and b and implements the function "a & !b" ("a AND NOT b"), propagating an input SFQ pulse supplied at input a as an output SFQ pulse emitted from output z unless input b has been asserted with an SFQ pulse.

Figure 3:
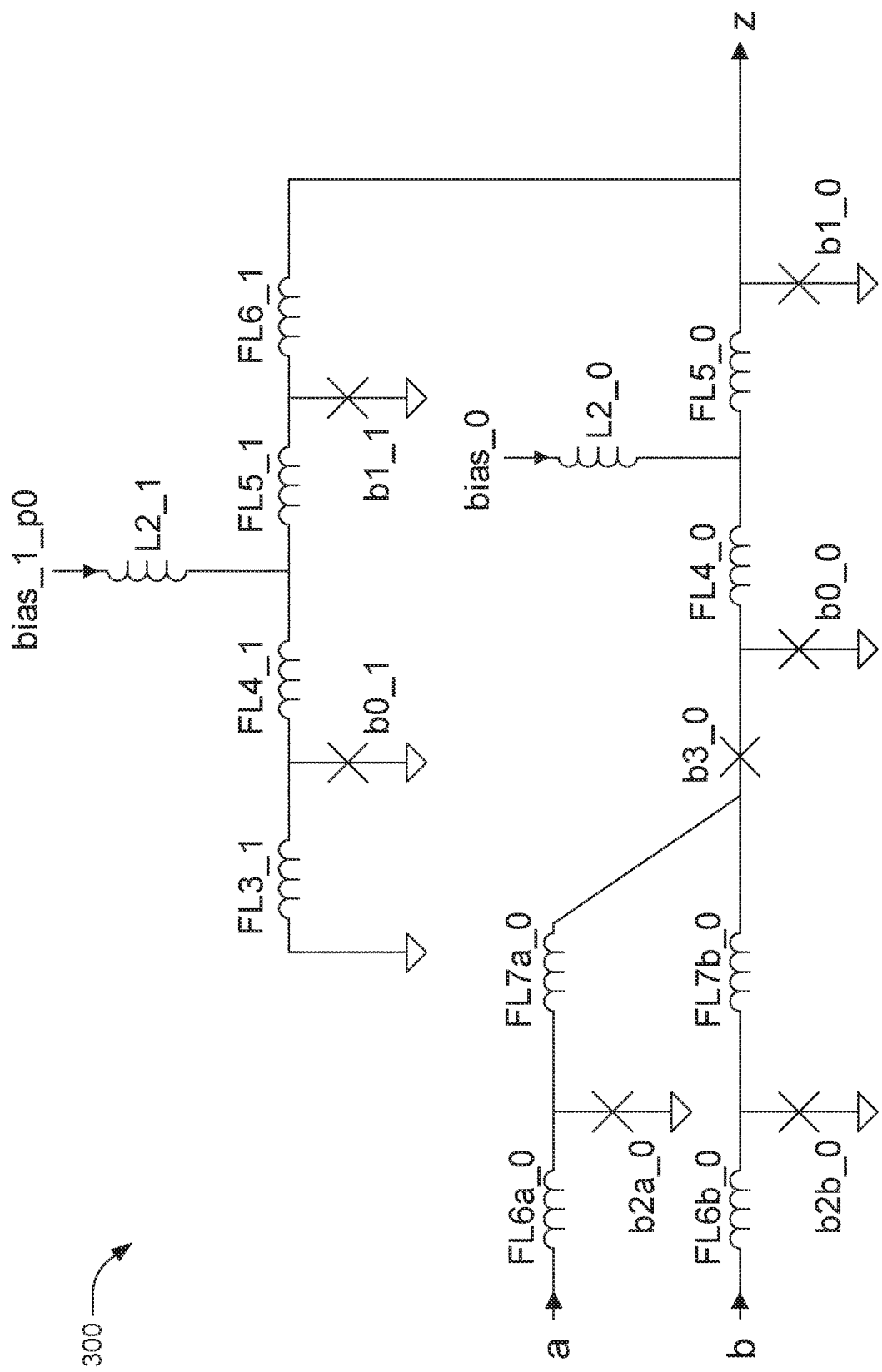

FIG. 3 shows a WPL exclusive-OR (XOR) gate circuit 300 that has a similar latching requirement as found in circuit 200, but instead of requiring an explicit SFQ-pulse readout input to enable readout of the logic result, the latching is performed by the AC clock waveform, which can be provided at both bias_0 and bias_1_p0. Data inputs are provided at input a and input b in the part of the AC clock cycle prior to the time that the circuit is sufficiently AC-biased to compute the logic result and propagate an input pulse to the output z. If only input a or only input b is asserted, the corresponding input SFQ positively biases logical decision Josephson junction b0_0. Later in the AC clock cycle, when the AC bias becomes sufficient, an output is thereby caused to be generated from the input. If, however, both inputs a and b are asserted, Josephson junction b3_0 triggers and rejects the inputs, preventing propagation of either input pulse to output z under greater AC biasing conditions later in the AC clock cycle. The section of circuit 300 at the top of FIG. 3, stemming upward from the node of output z, functions to reset the gate circuit back to an initial state.

Figure 4:
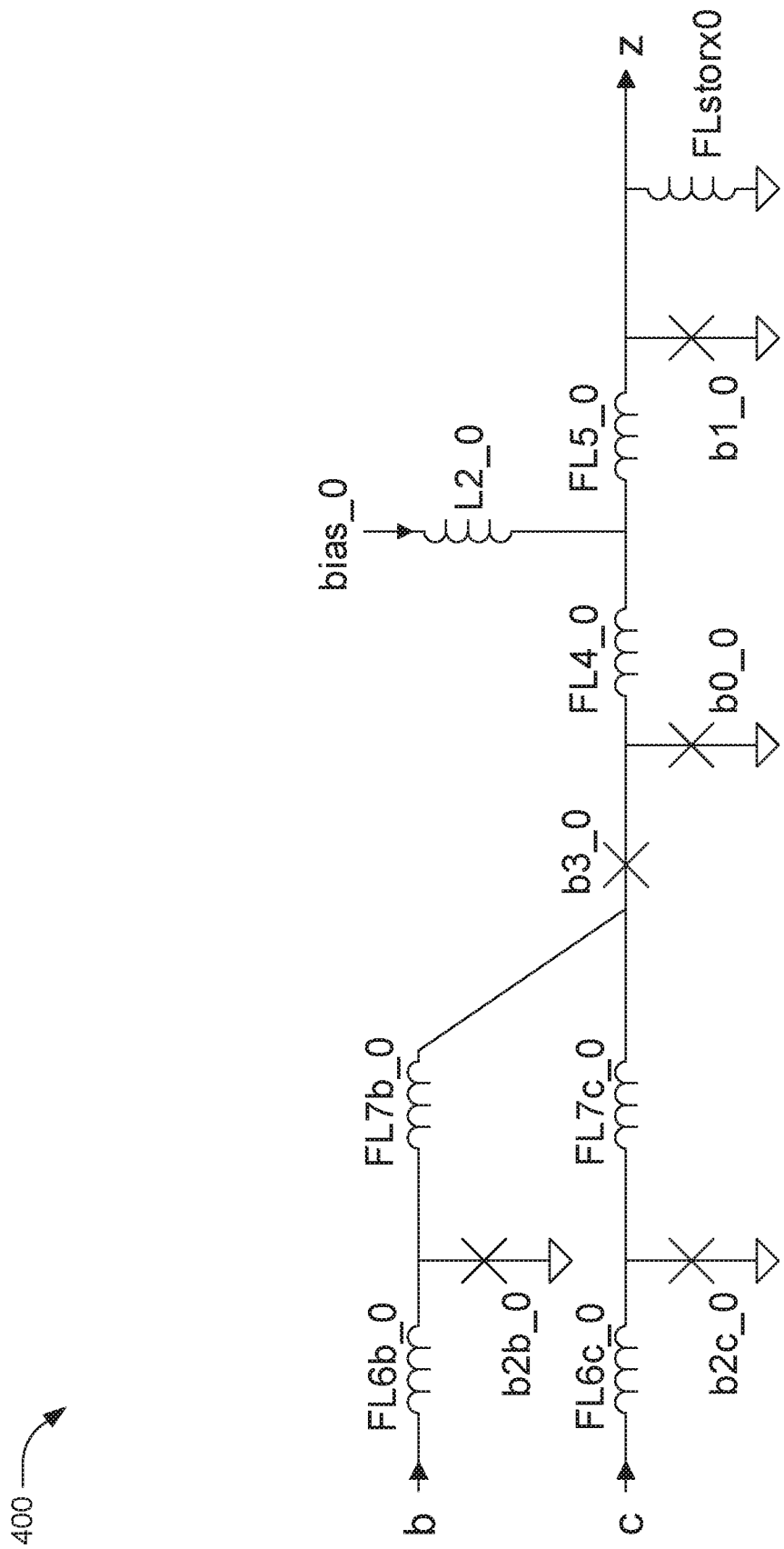

WPL XOR gate circuit 400 of FIG. 4 is a more area-efficient version of gate circuit 300 of FIG. 3, the difference between the two circuits being that the reset circuitry at the top of circuit 300 is replaced in circuit 400 with inductor to ground FLstorx0. The basic operation of XOR gate circuit 400 is the same as that of XOR gate circuit 300.

Figure 5:
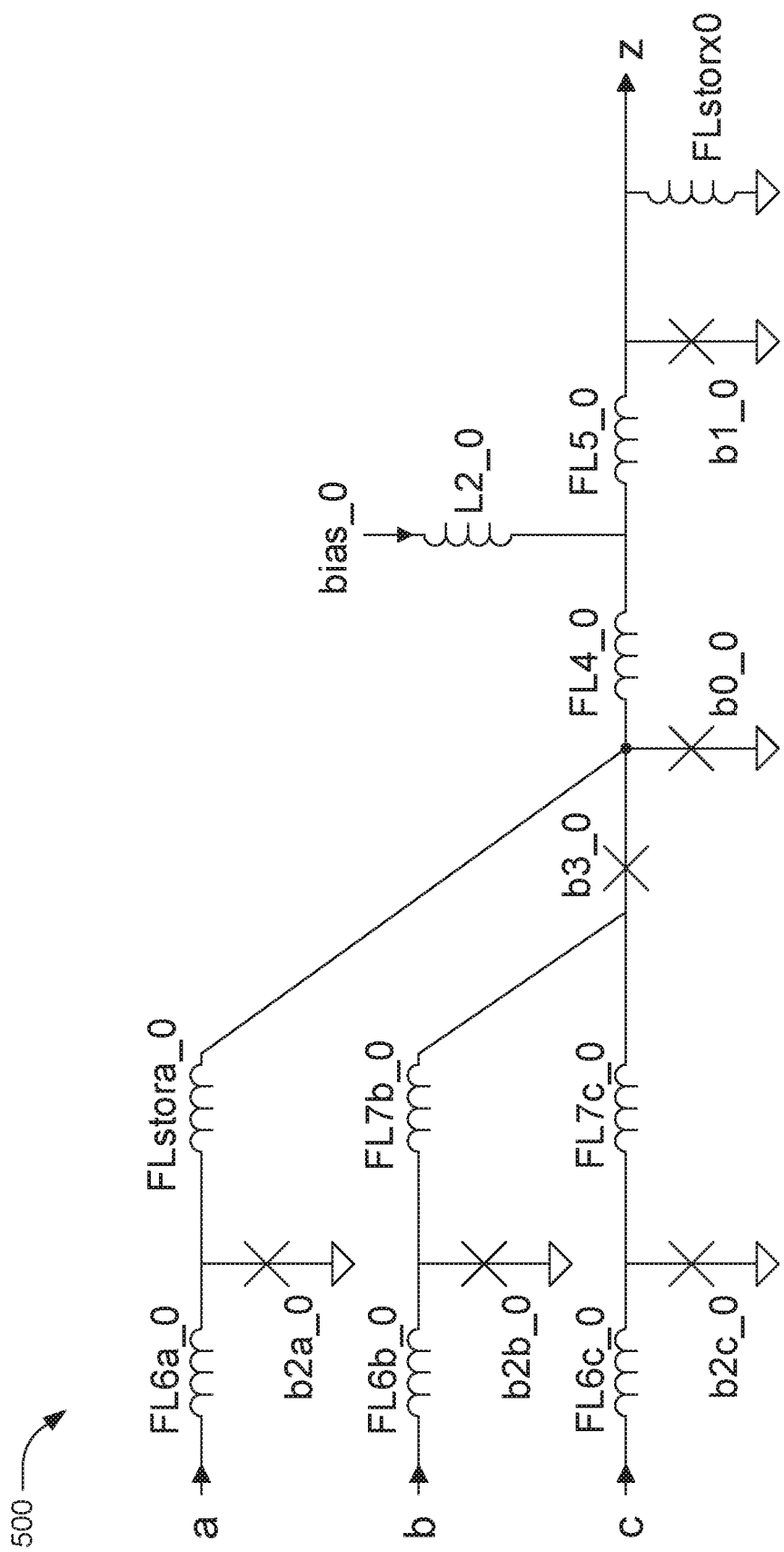

WPL XOR gate circuit 500 of FIG. 5 is similar to gate circuit 400 of FIG. 4, but adds a third input, input a. In circuit 500, the AC bias alone is insufficient to propagate an input pulse on either of inputs b or c to the output z; input a must also be asserted to provide the extra biasing needed to propagate an input pulse to the output. Accordingly, input a functions to receive an explicit SFQ latch enable signal, making the logic function of circuit 500 "a AND (b XOR c)."

Figure 6:
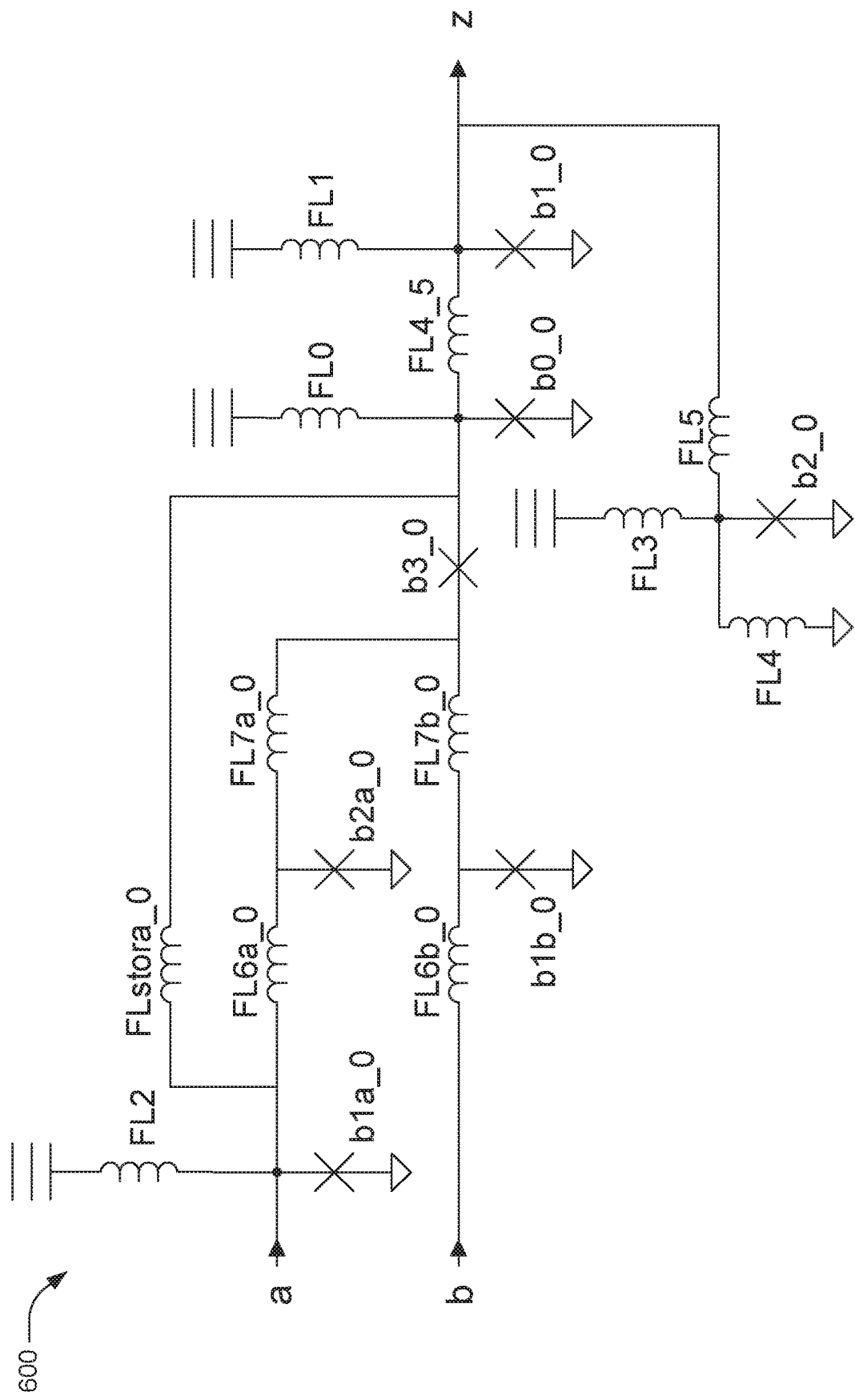

WPL gate circuit 600 of FIG. 6 provides another way to implement an "a AND NOT b" function. In essence, input a in FIG. 6 replaces inputs a and b of circuit 500 of FIG. 5; input b in circuit 600 corresponds to input c of circuit 500. Bias terminals, represented in FIG. 6 by three horizontal lines, can provide both AC and DC bias, as needed.

Figure 7:
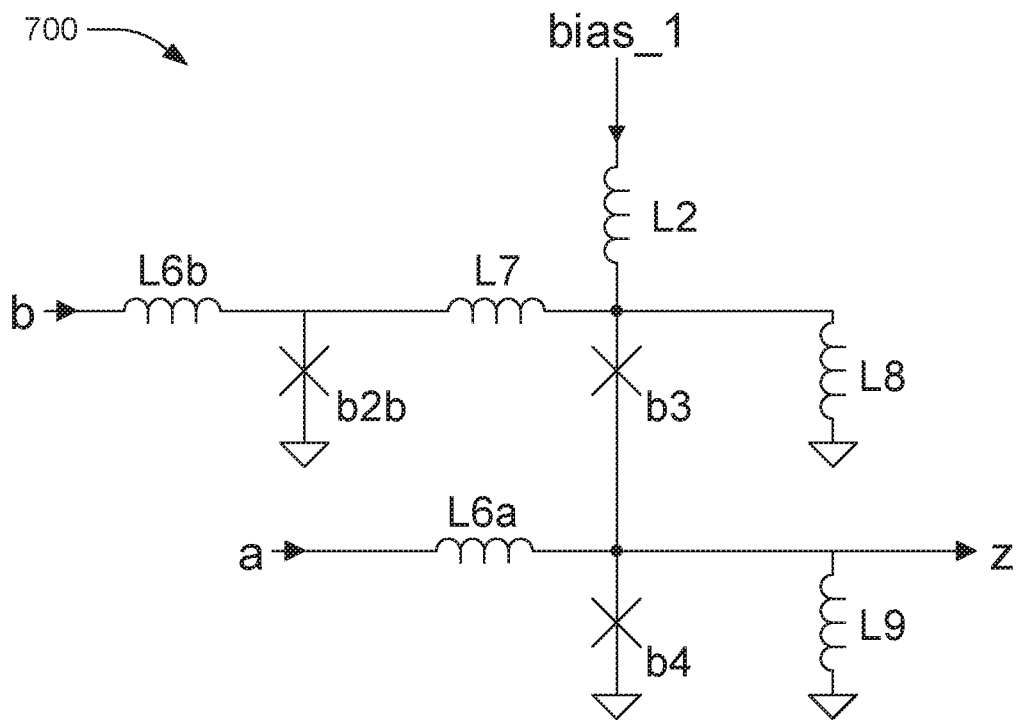

WPL gate circuit 700 of FIG. 7 also provides another way to implement an "a AND NOT b" function. An SFQ pulse provided on input a propagates to the output z unless input b is asserted. The operation of gate circuit 700 is similar to that of gate circuit 200 of FIG. 2, but circuit 700 does not include a transformer.

The timing diagrams of FIGS. 8B and 9B show simplified operating waveforms for corresponding respective circuits 800, 900 illustrated in FIGS. 8A and 9A, demonstrating the common weakness that is present in the above-described RQL implementations shown in FIGS. 2 through 7, all of which effectively implement a level-sensitive latch 804 or 904 as the readout. This latch 804, 904 may either have an explicit SFQ enable input signal or may be enabled solely by the AC clock, but in either case the latch 804, 904 is transparent to logical "1" values (high data input signals) when the enable signal En is logical "1" (high) and is transparent to logical "0" values (low data input signals) when the enable signal En is logical "0" (low). Thus, latch 804, 904 potentially allows glitches 806 or 906 from the XOR stage 802 or the A-AND-NOT-B stage 902 to propagate 808, 908 through the respective latch 804 or 904. This propagation 808, 908 can occur because both the input signals A, B and latch width are asserted for approximately one half of an AC clock cycle. The enable signal En in each case is supplied after the rising edge arrivals of the inputs A, B, but since the respective duty cycles of the input and enable signals are similar to each other, each of designs of FIGS. 2 through 7 can leave the latch 804, 904 enabled while the falling edges of the input signals A and/or B are arriving. This issue of capturing an incorrect value is best noted at 806 in FIG. 8B (where input A goes low while input B is still high) and 906 in FIG. 9B (where input B goes low while input A is still high). Outputs 808, 908 are faulty, rather than an accurate depiction of the intended respective logical function, because in the RZ data encoding scheme of WPL, an assertion to high of an input data signal is considered an assertion to high for the entire AC clock cycle. Whether these glitches 806, 906 are actually propagated 808, 908 can depend on the exact arrival times and frequency of operation.

In FIG. 8B, corresponding to the A XOR B arrangement 800 of FIG. 8A, the correct gate functionality is demonstrated by an assertion 812 of output signal Z when the input A is enabled 810 but the input B is not, or by an assertion 816 of output signal Z when the input B is enabled 814 but the input A is not. However, glitches 818, 806 in the A^B signal (i.e., the output of XOR stage 802) result from imperfect timing alignment of input signals A and B, the second of which, glitch 806, propagates through to the output Z as glitch 808, which is improperly "1" even though both inputs A and B are "1" at the corresponding time in the AC clock cycle. Because the XOR stage 802 glitches high while the latch 804 is transparent to rising edges, the output Z glitches 808.

By contrast, RQL A-AND-NOT-B gates like gate 900 are generally configured such that a pulse on the input B arrives before a pulse on the input A, so that, when input B is asserted, the assertion pulse blocks an assertion signal provided on input A and prevents it from propagating to the output. However, this arrangement results in the problem that when input B is deasserted, input A is likely still asserted (owing to the similar duty cycle of the two data input signals), and, very late in the AC clock cycle, this discrepancy can "leak out" to the output and cause an incorrect result to be propagated. In FIG. 9B, corresponding to the A-AND-NOT-B arrangement 900 of FIG. 9A, the correct gate functionality is demonstrated by an assertion 912 of output signal Z when the input A is enabled 910 but the input B is not. However, glitch 906 in the A & !B signal (i.e., the output of A AND NOT B stage 902) results from imperfect timing alignment of input signals A and B, and glitch 906 propagates through to the output Z as glitch 908, which is improperly "1" even though both inputs A and B are "1" at the corresponding time in the AC clock cycle. Because the A-AND-NOT-B stage 902 glitches high while the latch 904 is transparent to rising edges, the output Z glitches 908. As discussed above with respect to FIG. 8B, it should not be the case that even though inputs A and B are asserted in the same AC clock cycle, resulting in one output (low Z), the deassertion of one input signal can cause a different output result (high Z) within the same clock cycle. Thus, the glitch at 908 is an undesirable artifact of a weakness in the design of circuit 900.

Figure 10:
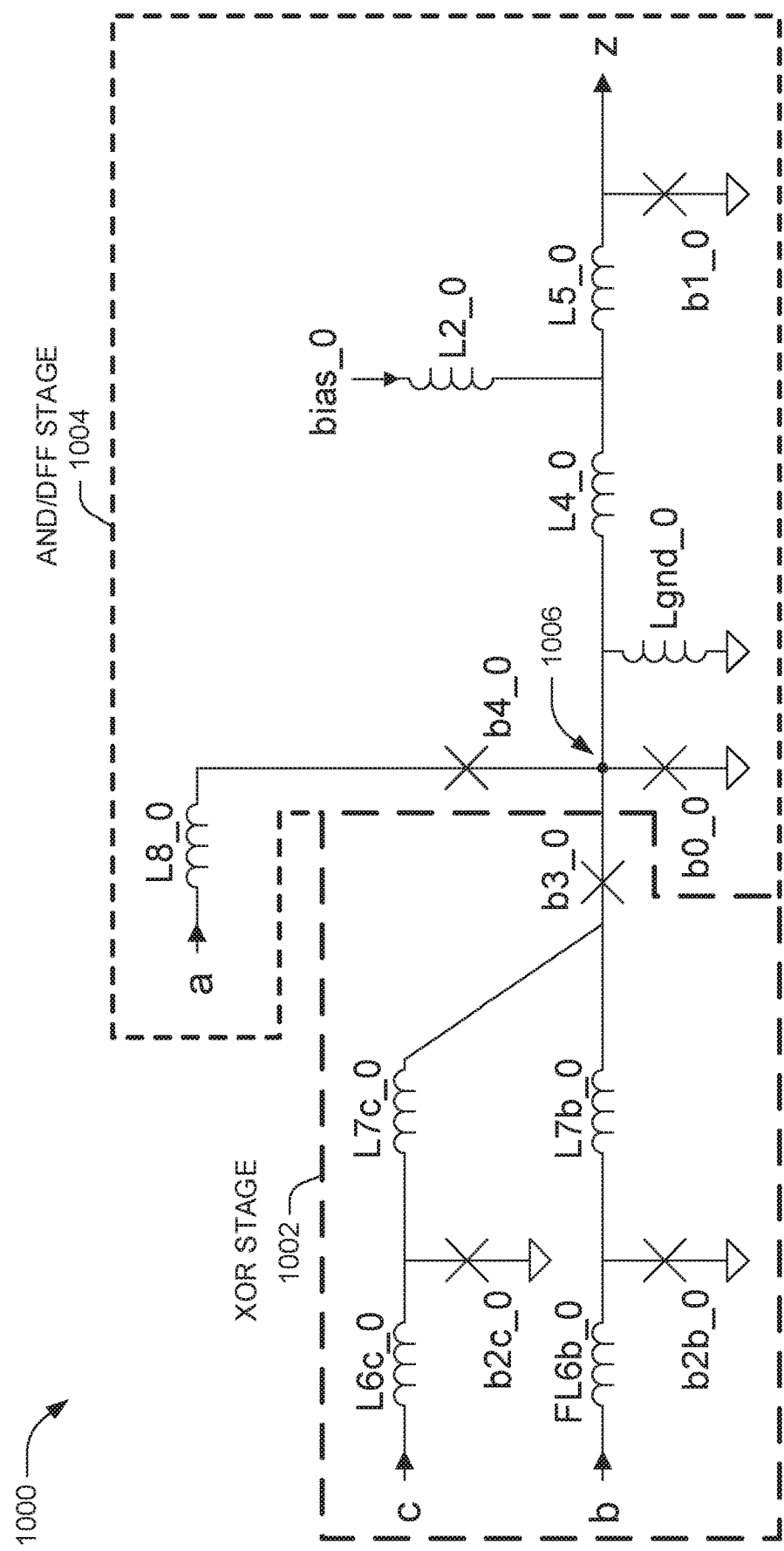
FIG. 10 is a schematic diagram of an example RQL WPL clocked XOR gate.

FIG. 10 shows a circuit schematic of a two-stage superconducting gate circuit 1000, specifically, a clocked XOR gate, that rectifies the design weakness that gives rise to the race condition issue in the WPL designs of FIGS. 2 through 7. Circuit 1000 can correspond to circuit 100 of FIG. 1A. The clocked XOR gate circuit 1000 consists of an XOR stage 1002 and a D flip-flop (DFF) stage 1004 that can also be considered an AND stage. Accordingly, stage 1004 is sometimes referred to as, or labeled, "AND/DFF" in the present application. The XOR stage 1002 performs the XOR logic function and is the same as that used in several of the circuit designs 300 through 600. Josephson junctions b2c_0 and b2b_0 are configured to accept input SFQ pulses on inputs c and b, respectively, and Josephson junction b3_0 is configured to reject input pulses when pulses from both inputs b and c are asserted substantially simultaneously, i.e., within the same pre-critical-biasing portion of the AC clock cycle. The AND/DFF stage 1004 consequently reads out the result of this operation when input a arrives. Upon the arrival of an input SFQ pulse at input a, either upper Josephson junction b4_0 or logical decision Josephson junction b0_0 triggers. Logical decision Josephson junction b0_0 triggers and propagates the pulse to the output z if a single input has arrived from either input b or input c and the resulting SFQ is present and providing a direct current (DC) to Josephson junction b0_0. If no SFQ is providing DC to Josephson junction b0_0, either because no inputs arrive at input b or input c or because inputs have arrived at both input b and input c and Josephson junction b3_0 has triggered and rejected them, then upper Josephson junction b4_0 triggers and rejects the input from input a and there will be no change in the state of the output z.

A distinguishing feature of circuit 1000 over other WPL gate designs, e.g., over circuit 400 of FIG. 4, is the addition of upper Josephson junction b4_0, which, in effect, converts the second stage 1004 from a level-sensitive latch to an edge-triggered flip-flop. Josephson junctions b0_0 and b4_0, coupled at joining node 1006, can act as a comparator. In designs such as those illustrated in FIGS. 2 through 7, the second stage 804 or 904 acts more as a level-sensitive latch. During the assertion of enable input En, the latch stage 804 or 904 is transparent, such that changes to inputs A or B (corresponding to inputs b and c in circuit 900) occurring after the assertion of the enable input En could be passed through the latch to result in an incorrect output. The inclusion of upper Josephson junction b4_0 in gate circuit 1000 permits the assertion of input a as a readout pulse to provide an edge-triggered readout of the output, because such a readout pulse will either generate a readout pulse propagated through output z or upper Josephson junction b4_0 will dissipate the readout pulse.

In circuit 1000, the relation between the XOR stage 1002 and the AND/DFF stage 1004 introduces a timing requirement where all potential inputs at input b and input c must arrive before the input at input a. This is generally solved by setting the AC bias of the drivers of the inputs b and c to be an earlier phase, often 90 degrees earlier, but any mechanism that enforces the order of events is acceptable.

Figure 11:
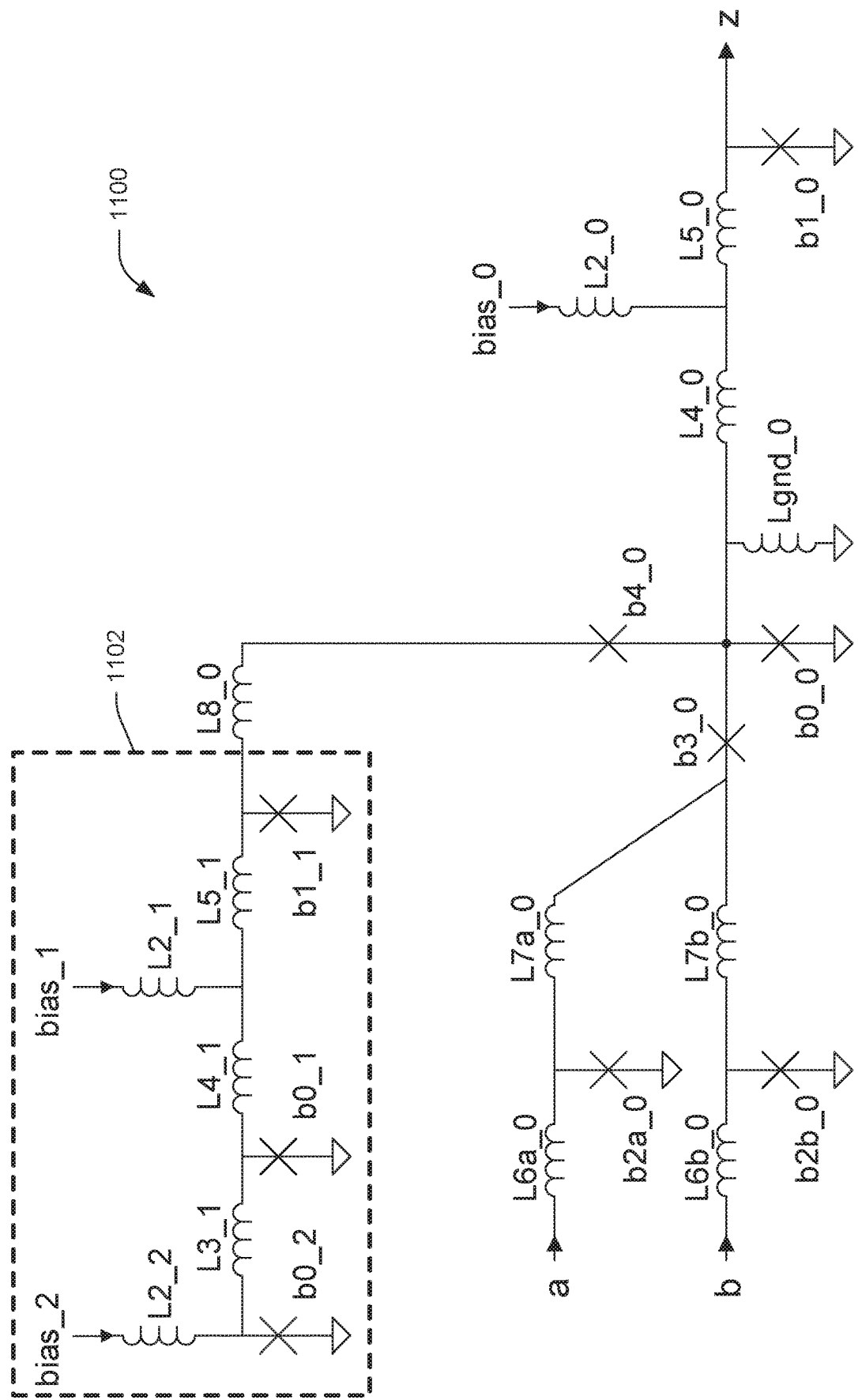
FIG. 11 is a schematic diagram of an example RQL WPL XOR gate.
Figure 12:
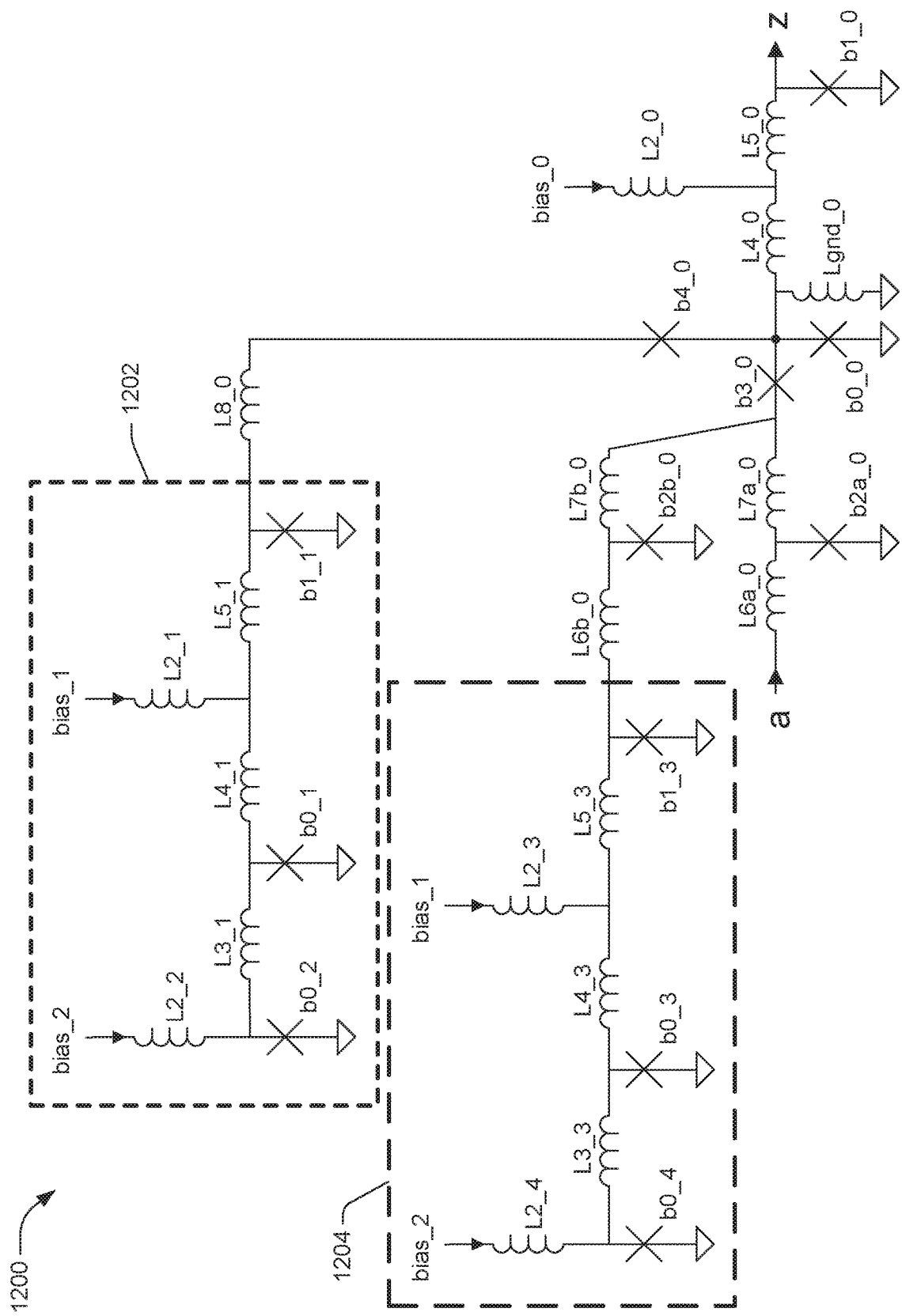
FIG. 12 is a schematic diagram of an example RQL WPL NOT gate.
Figure 13:
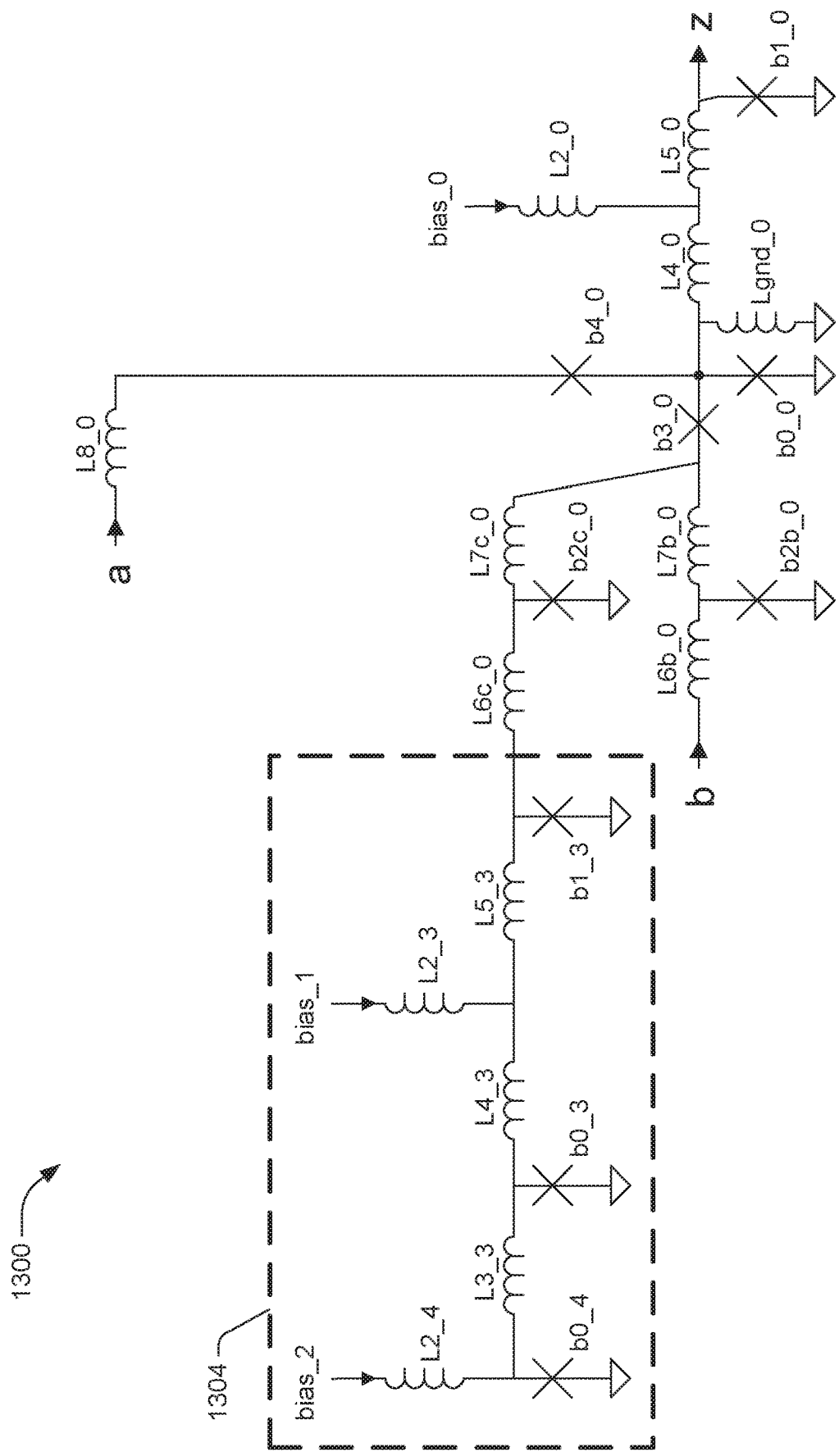
FIG. 13 is a schematic diagram of an example RQL WPL A-AND-NOT-B gate.

Accordingly, the logic function of gate circuit 1000 when realized within a WPL circuit is (a AND (b XOR c)). FIGS. 11, 12, and 13 illustrate how different inputs may be tied off in a logic "1" state with pulse generators (e.g., Josephson junctions supplied with sufficient AC bias to cause them to trigger both positively and negatively every AC cycle) to achieve the functions XOR, NOT, and A-AND-NOT-B. In these examples the pulse generators that are used to tie inputs can be buffered by an additional JTL. This JTL is not strictly necessary, but provides improved operating margins.

XOR gate circuit 1100 of FIG. 11, which can correspond to gate 120 of FIG. 1B, is similar to circuit 1000 of FIG. 10, but with the flip-flop clocking input a of FIG. 10 tied off to a pulse generator 1102, which can correspond to pulse generator 122 of FIG. 1B. Josephson junction b0_2 in FIG. 11 is overbiased with AC and acts as an oscillator to generate "1"s every AC clock cycle. Accordingly, the logic function produced at output z in circuit 1100 is a XOR b.

NOT gate circuit 1200 of FIG. 12, which can correspond to gate 140 of FIG. 1C, is similar to circuit 1100 of FIG. 11, but with one of the data inputs a or b of FIG. 11 likewise tied off to a pulse generator 1204, which can correspond to pulse generator 144 of FIG. 1C. The flip-flop clocking input remains tied off to a pulse generator 1202, which can correspond to pulse generator 142 of FIG. 1C. Just like Josephson junction b0_2, Josephson junction b0_4 in FIG. 12 is overbiased with AC and acts as an oscillator to generate "1"s every AC clock cycle. Accordingly, the logic function produced at output z in circuit 1200 is NOT a.

A-AND-NOT-B gate circuit 1300 of FIG. 13, which can correspond to gate 160 of FIG. 1D, is similar to circuit 1200 of FIG. 12, but without the logical clock input tied off to a pulse generator 1104; stated another way, gate circuit 1300 is similar to circuit 1000 of FIG. 10, but with one of the data inputs b or c of FIG. 10 tied off to a pulse generator 1304, which can correspond to pulse generator 162 of FIG. 1D. Josephson junction b0_4 in FIG. 13 is overbiased with AC and acts as an oscillator to generate "1"s every AC clock cycle. The first stage of gate circuit 1300 thus acts as an inverter, just as does the first stage of gate circuit 1200. As discussed above with respect to gate circuit 1000, the latter stage of gate circuit 1300 functions as an AND gate. Accordingly, the logic function produced at output z in gate circuit 1300 is (a AND (NOT b)).

Figure 14A:
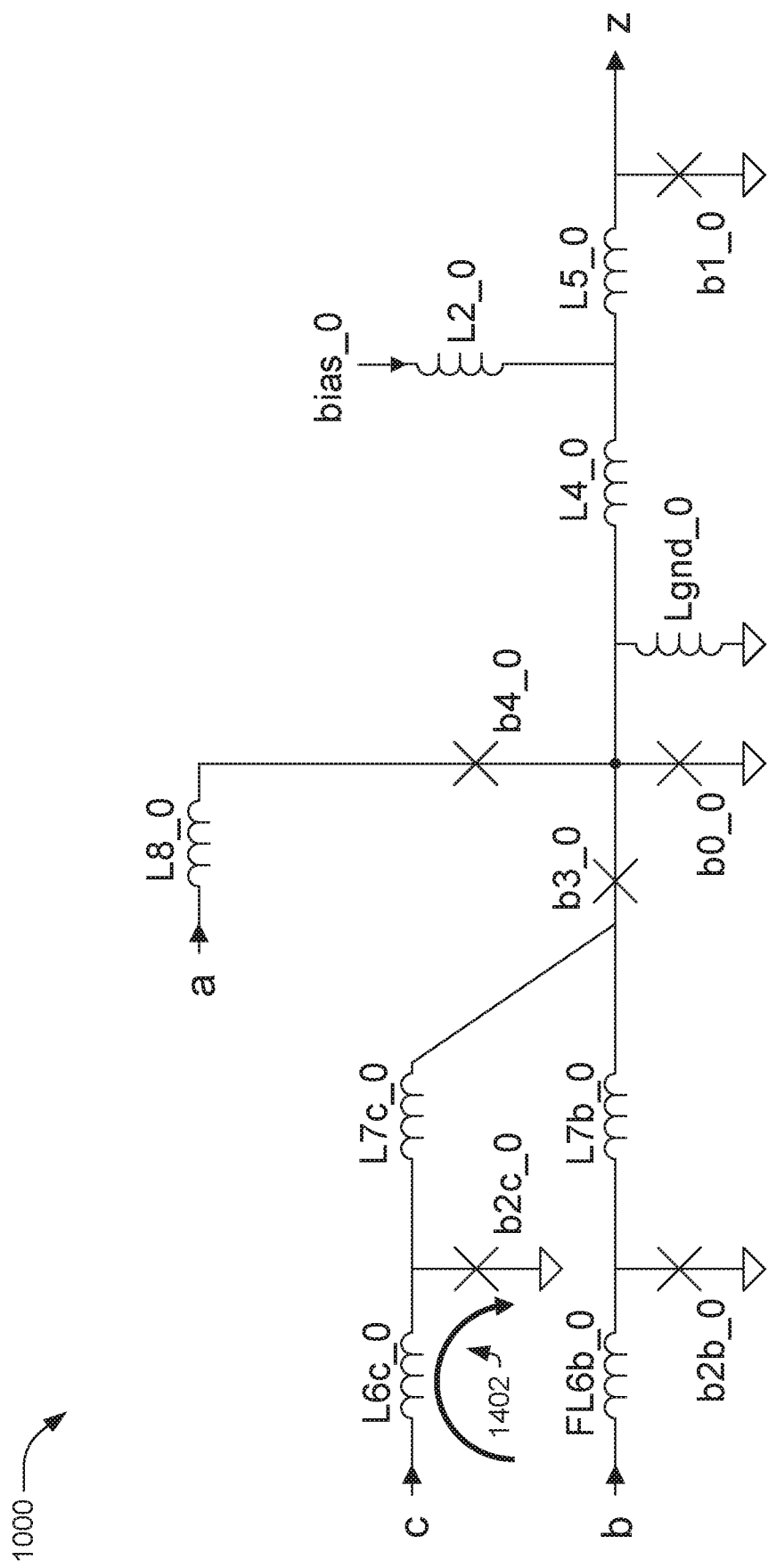
FIGS. 14A-14J illustrate an example sequence of operations in the gate of FIG. 10.
Figure 14B:
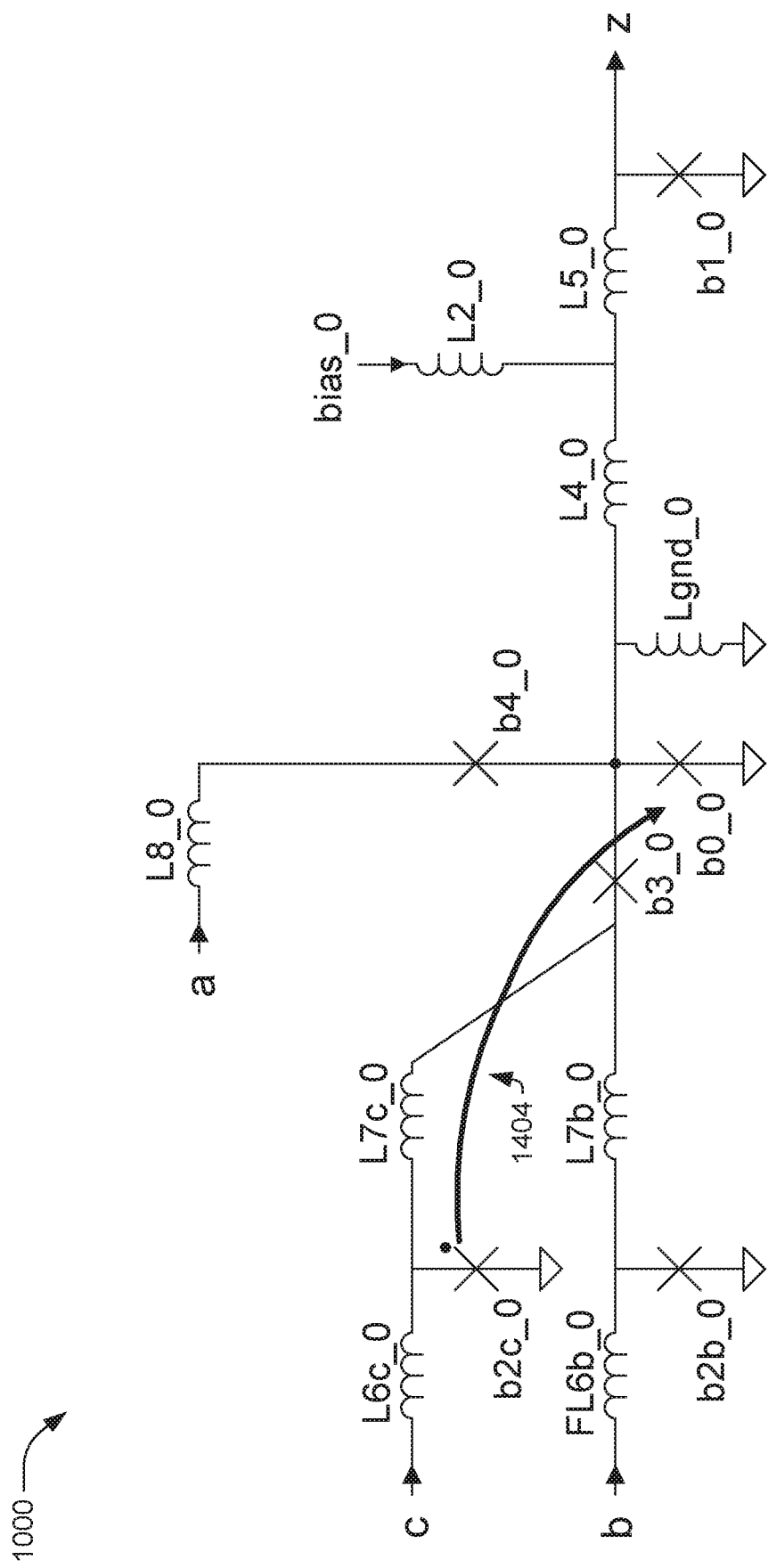
Figure 14C:
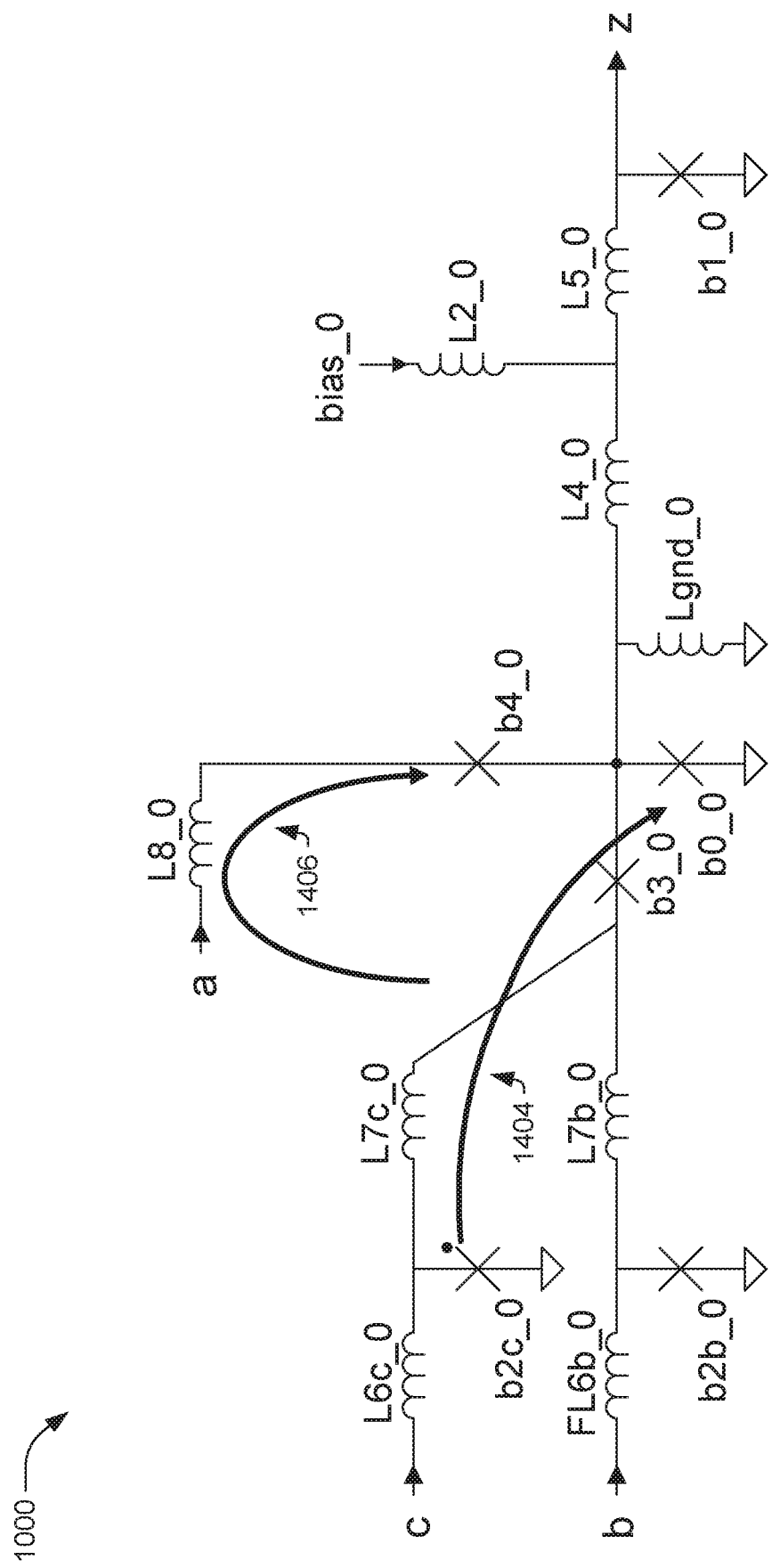
Figure 14D:
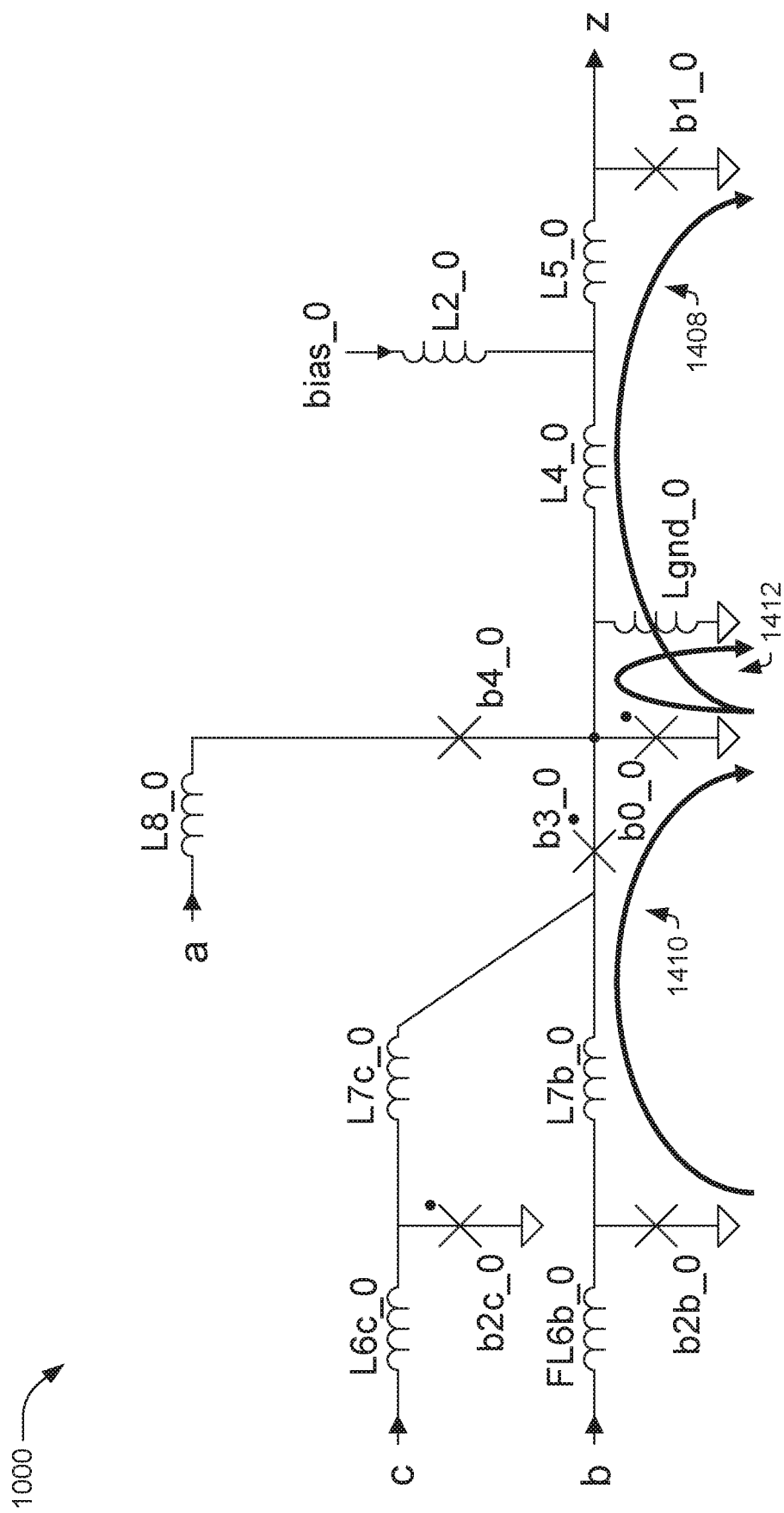
Figure 14E:
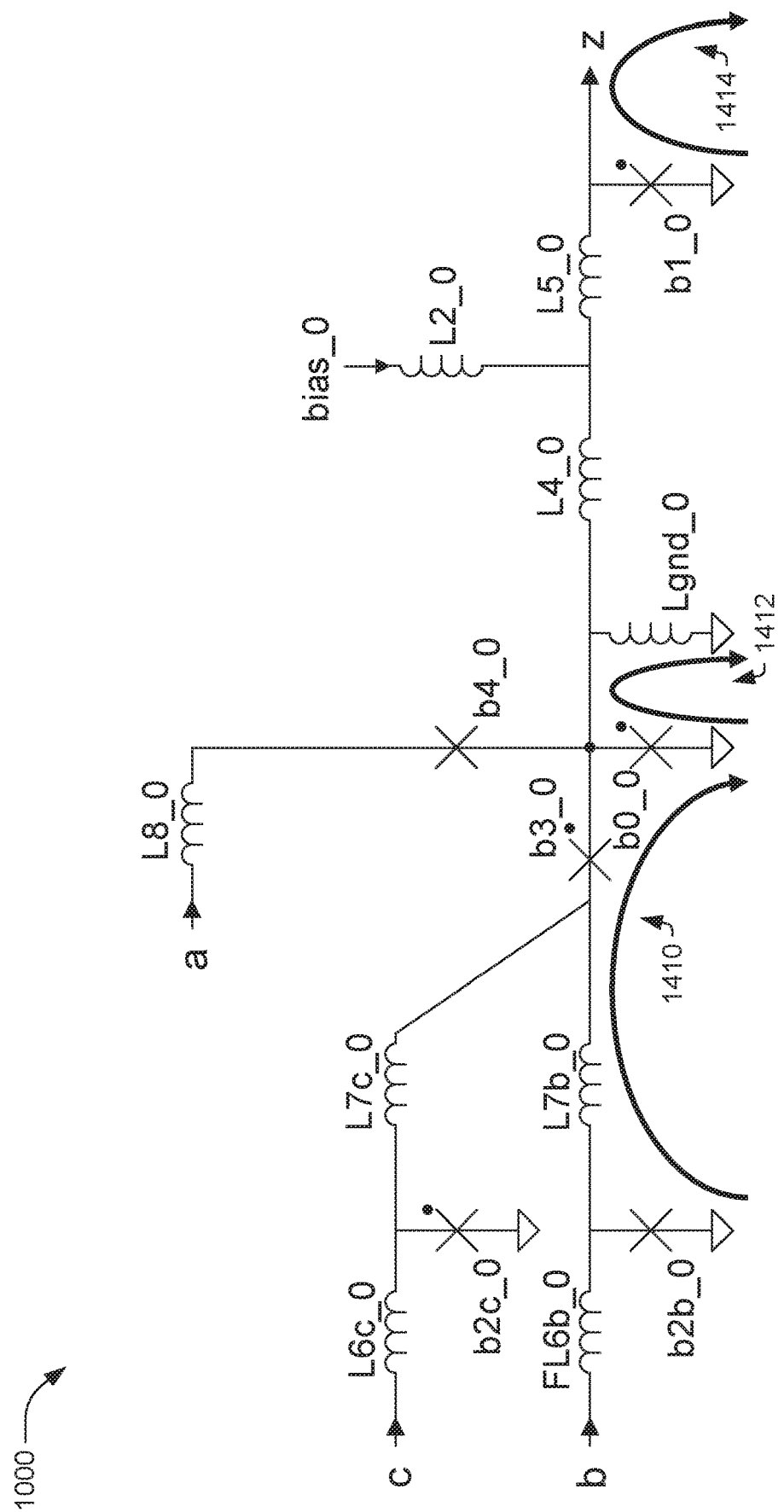

FIGS. 14A through 14J illustrate the operation of the clocked XOR gate circuit 1000 of FIG. 10 for the case where the first data input c and the clocking input a are asserted, but the second data input b is not asserted. In all of FIGS. 14 through 16, dots are used near Josephson junctions to indicate the direction of triggering and subsequent untriggering according to the standard convention. In FIG. 14A, a positive SFQ pulse 1402 arrives at input c, triggering first data input Josephson junction b2c_0 and, as shown in FIG. 14B, leaving a circulating SFQ 1404 in the loop formed by first data input Josephson junction b2c_0, first data storage loop inductor L7c_0, XOR-enforcing Josephson junction b3_0, and logical decision Josephson junction b0_0. This single input and resultant SFQ 1404 biases logical decision Josephson junction b0_0 and XOR-enforcing Josephson junction b3_0, but is insufficient to trigger either of them. Some time later, e.g., approximately 90 degrees of the AC clock cycle later, a positive SFQ pulse 1406 arrives at logical clock input a, putting current through the comparator formed by Josephson junctions b4_0 and b0_0. The additional current 1406 as experienced by logical decision Josephson junction b0_0, in combination with the already-experienced current 1404 from the input that arrived earlier at input c and the AC bias, is sufficient to trigger logical decision Josephson junction b0_0. Thus, logical decision Josephson junction b0_0 triggers, and, as shown in FIGS. 14D and 14E, propagates a positive SFQ pulse 1408 to the output z by triggering output Josephson junction b1_0 to emit output SFQ pulse 1414.

As a side effect of the triggering of logical decision Josephson junction b0_0, XOR-enforcing Josephson junction b3_0 immediately triggers negatively in response. This introduces an undesired current 1410 into the loop formed by second data input Josephson junction b2b_0, second data storage loop inductor L7b_0, XOR-enforcing Josephson junction b3_0, and logical decision Josephson junction b0_0. The triggering of logical decision Josephson junction b0_0 also drives an SFQ 1412 into the loop formed by ground inductor Lgnd_0 and logical decision Josephson junction b0_0. The purpose of the storage of this current 1412 is to cancel out the undesired SFQ 1410 from the triggering of XOR-enforcing Josephson junction b3_0.

Figure 14F:
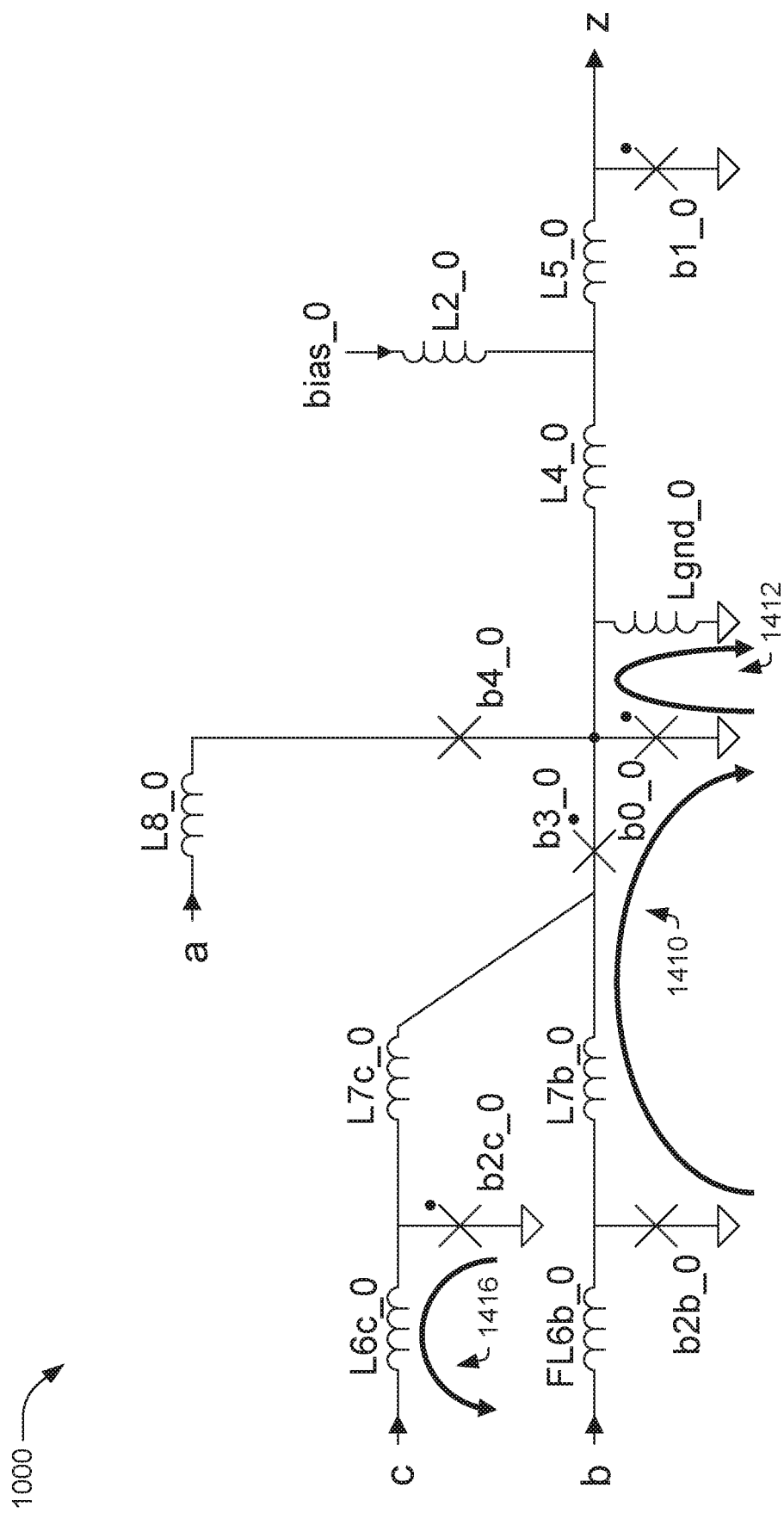

One half AC cycle later, the above sequence of events repeats with negative SFQ pulses to reset the gate circuit 1000 to an initial state. Thus, FIG. 14F shows a negative SFQ pulse 1416, reciprocal to the original asserting positive SFQ pulse 1402, entering circuit 1000 at first data input c.

Figure 14G:
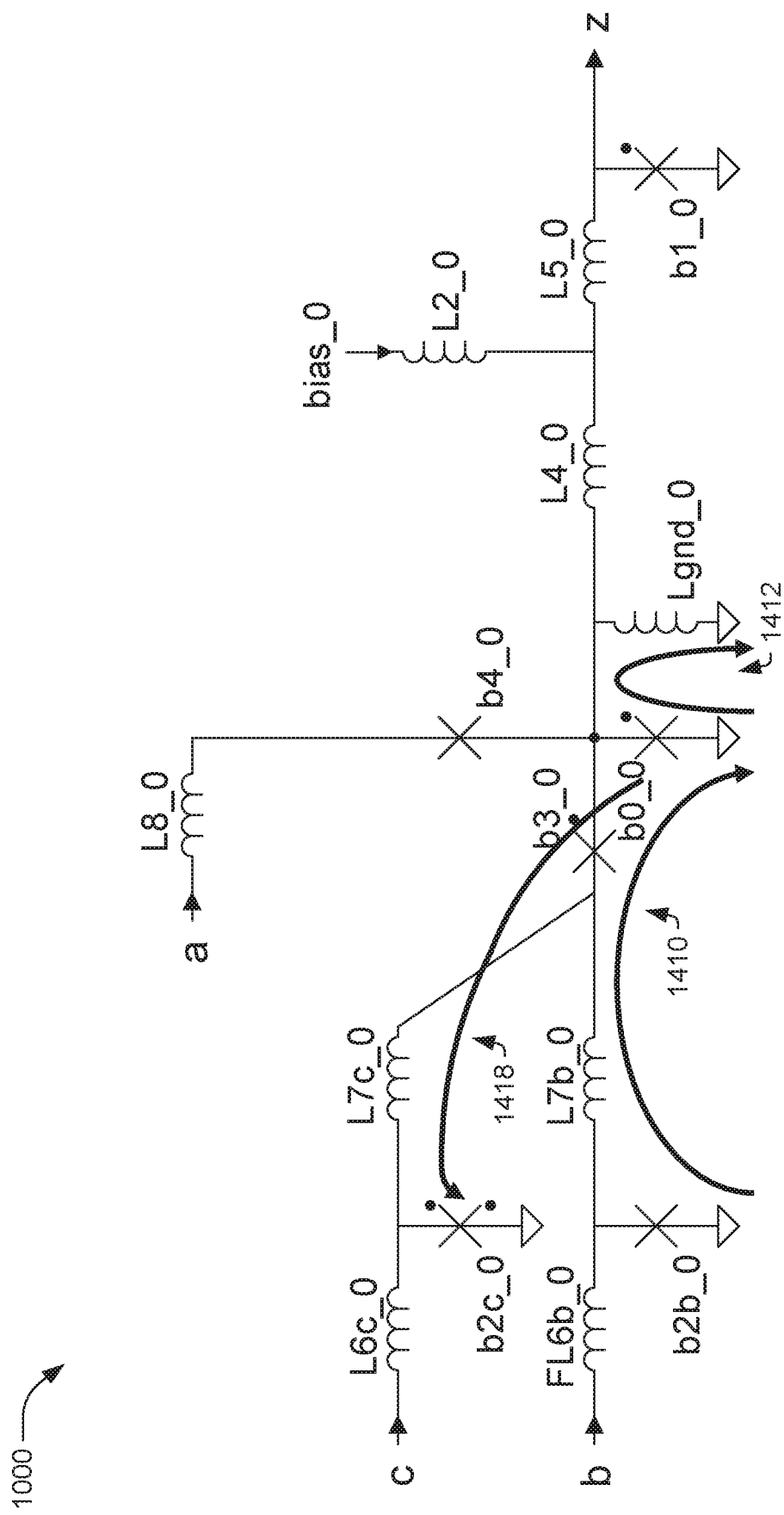
Figure 14H:
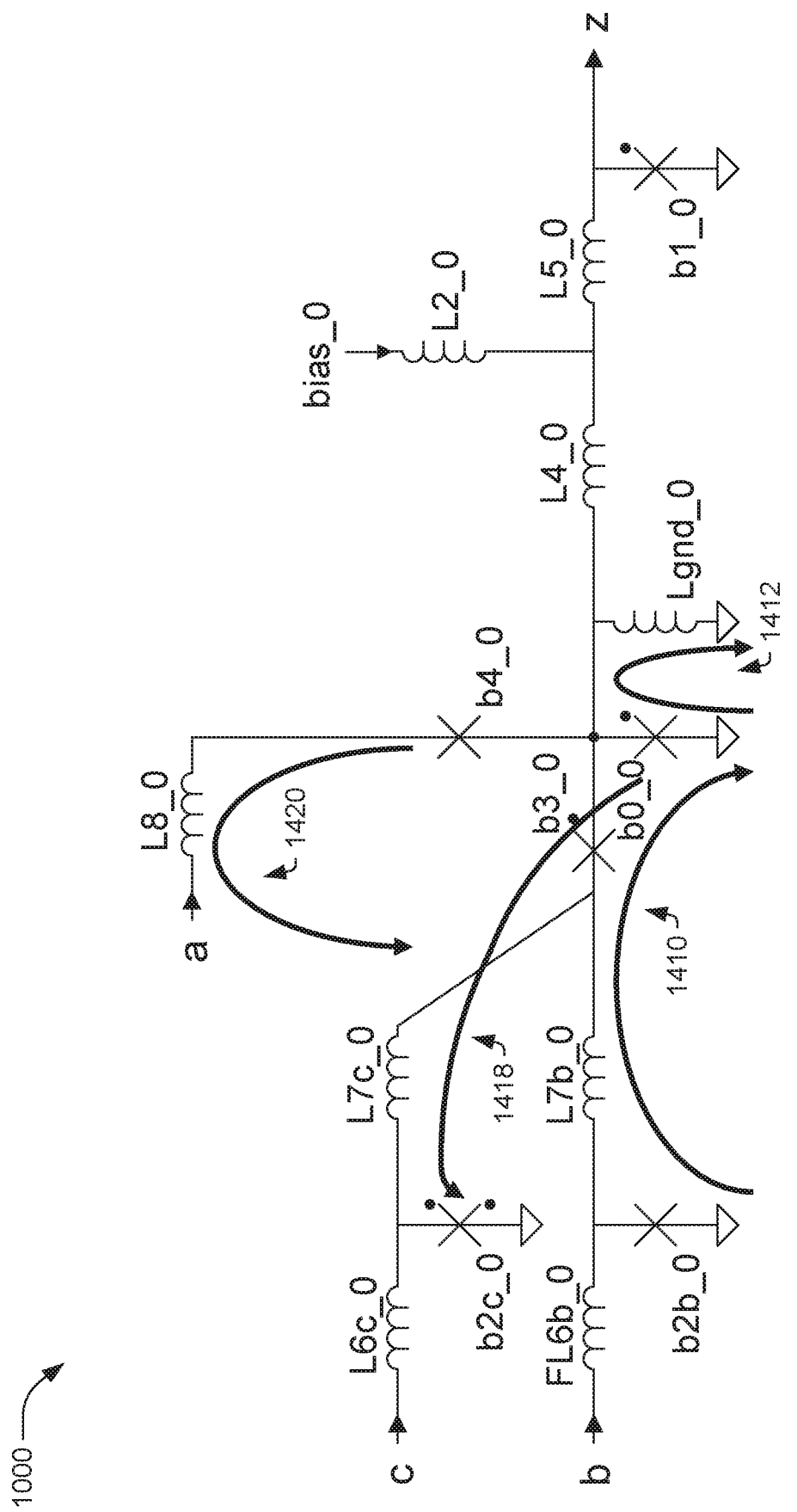
Figure 14I:
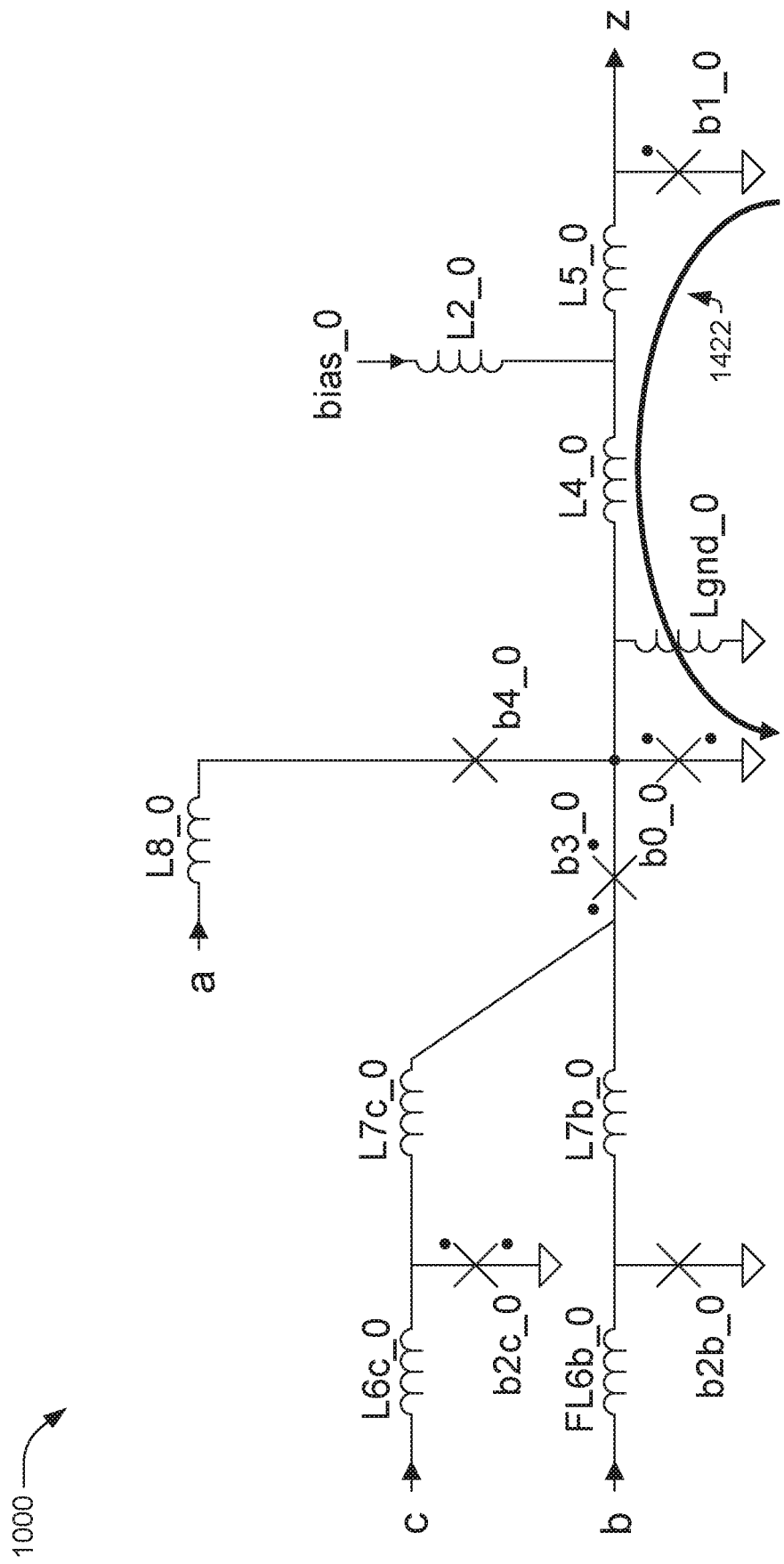
Figure 14J:
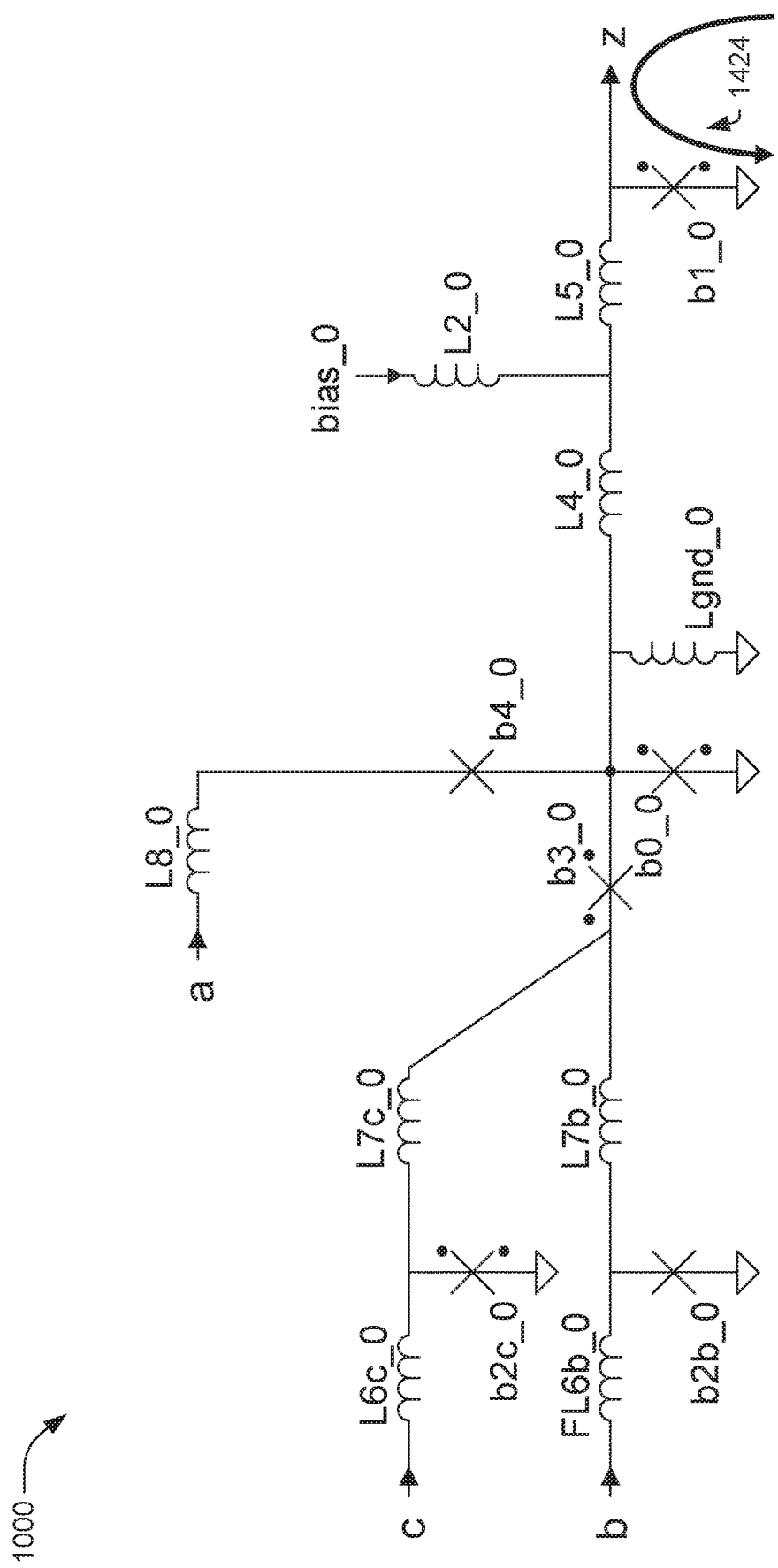

As shown in FIG. 14G, pulse 1416 causes the negative triggering ("untriggering") of first data input Josephson junction b2c_0, thereby causing the propagation of negative SFQ pulse 1416 as stored negative flux 1418 in the ground loop, netting a negative bias at logical decision Josephson junction b0_0, approximately equal to and opposite of the bias experienced by logical decision Josephson junction b0_0 when it was asserted positively under the conditions shown in FIG. 14B. FIG. 14H illustrates the introduction of a negative SQF pulse 1420 at logical clocking input a, reciprocal to pulse 1406 shown in FIG. 14C. The illustrated inputs together, plus the AC bias, suffice to trigger logical decision Josephson junction b0_0 negatively, which immediately also results in the untriggering of XOR-enforcing Josephson junction b3_0, resulting in the state shown in FIG. 14I, in which circuit 1000 is left with just one negative flux 1422 propagating towards the output z and untriggering output Josephson junction b1_0 to deassert the output z with SFQ pulse 1424, as shown in FIG. 14J, following which the circuit 1000 becomes reset to its initial state. The dual dots on each of the relevant Josephson junctions indicate that all triggered Josephson junctions have been untriggered in the course of circuit operation and each such Josephson junction has returned to its ground state.

Figure 15A:
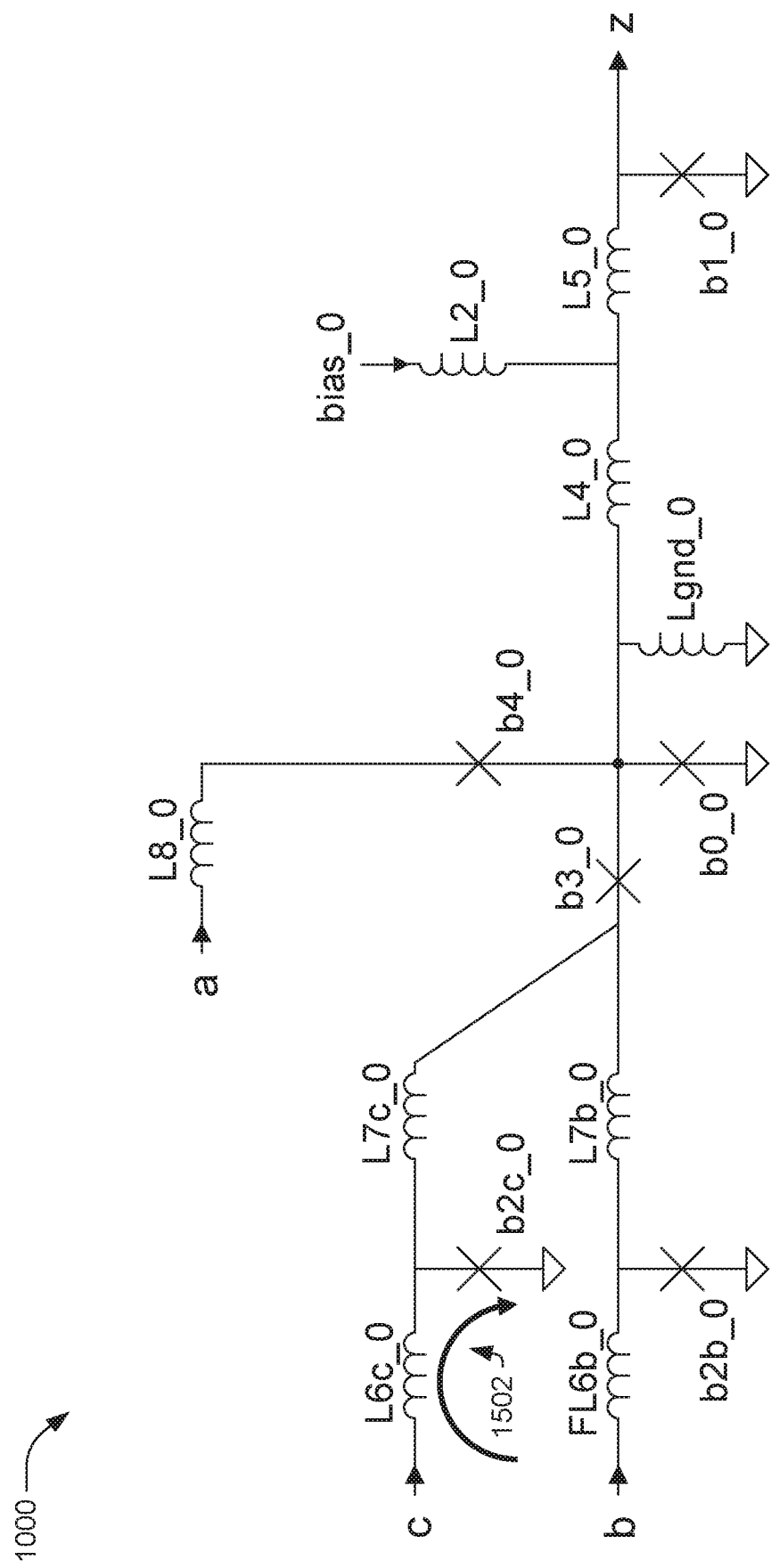
FIGS. 15A-15L illustrate another example sequence of operations in the gate of FIG. 10.
Figure 15B:
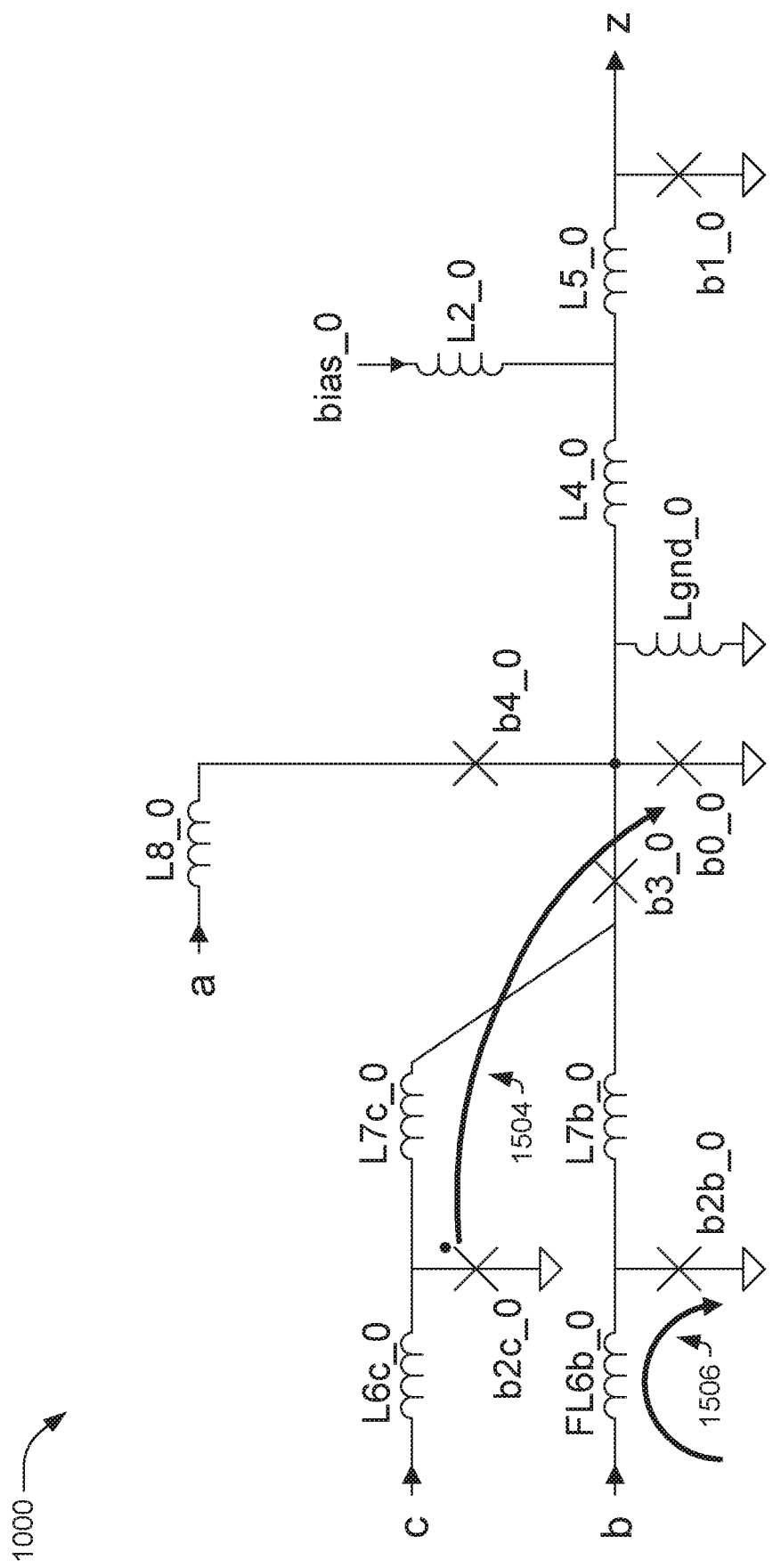
Figure 15C:
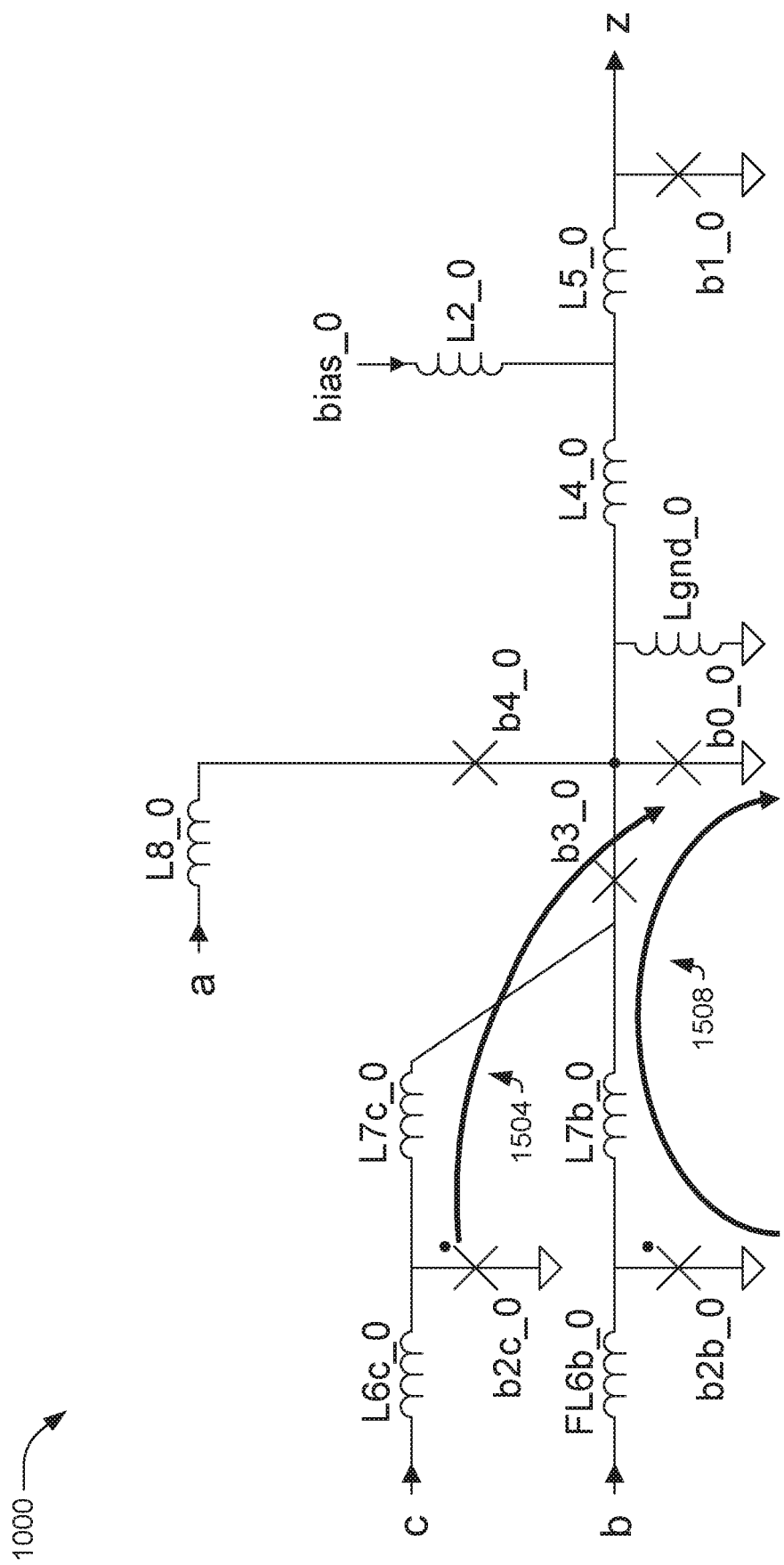
Figure 15D:
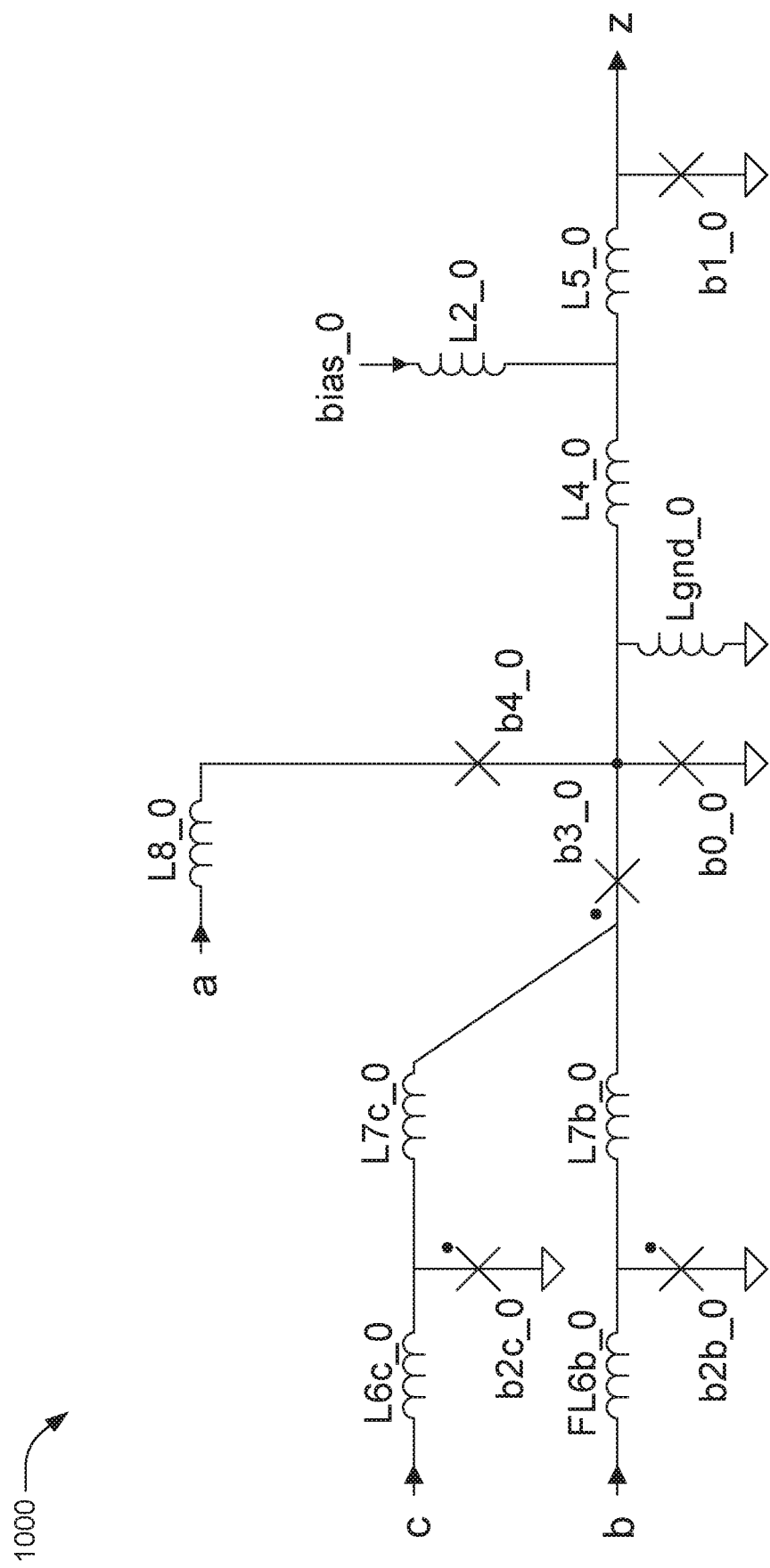
Figure 15E:
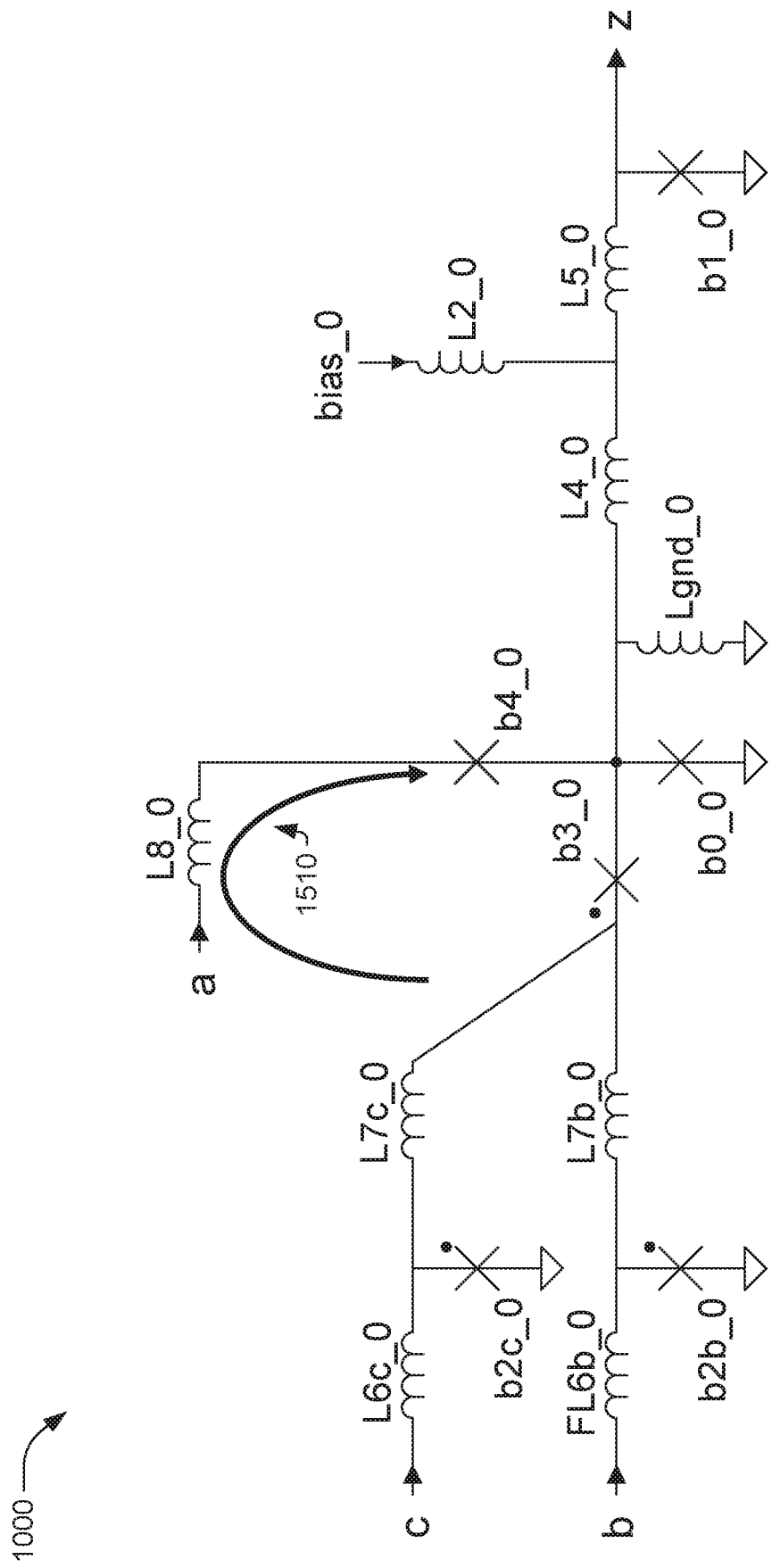
Figure 15F:
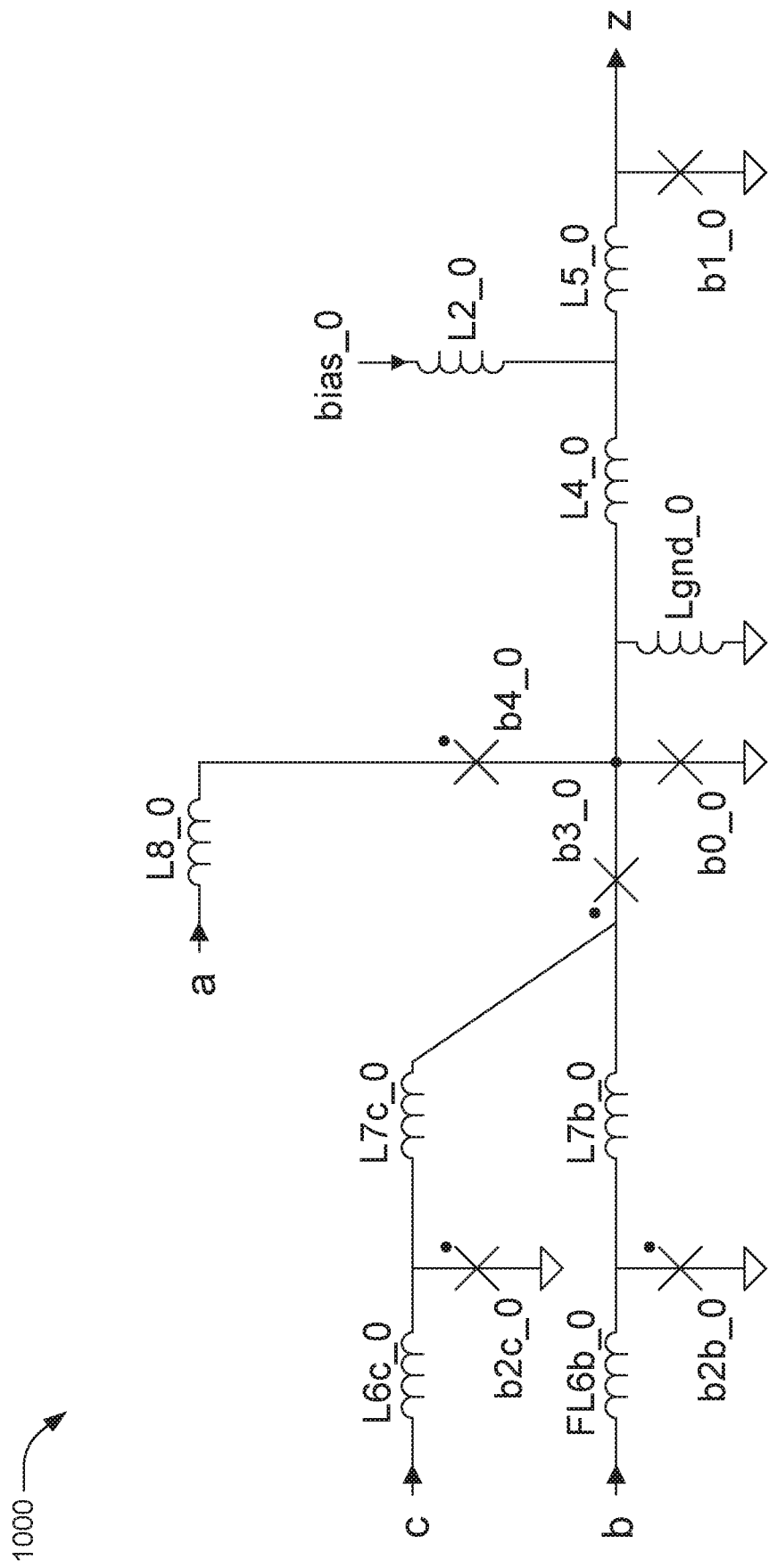

FIGS. 15A through 15L illustrate the sequences of operations in gate circuit 1000 for the scenario where both the inputs b and c are asserted in an example that would have caused a glitch in the designs of FIGS. 2 through 7. In the illustrated sequence, first data input c is shown being asserted with an incoming SFQ pulse 1502 in FIG. 15A prior to any assertion of second data input b in FIG. 15B, but this ordering is arbitrary. The only timing requirement is that both input b and input c arrive before input a. SFQs 1502, 1506 arrive at both of the data inputs c and b and trigger their respective data input Josephson junctions b2c_0 and b2b_0, putting two SFQs of current 1504, 1508 through XOR-enforcing Josephson junction b3_0, as shown in FIG. 15C, which triggers in response and rejects both inputs, as shown in FIG. 15D. Some time later, e.g., approximately 90 degrees of the AC clock cycle later, an SFQ 1510 arrives at input a, as shown in FIG. 15E. This SFQ 1510 puts current through both comparator Josephson junctions b4_0 and b0_0. Because there are no logical inputs DC biasing logical decision Josephson junction b0_0 at this point, upper Josephson junction b4_0 instead triggers and rejects the input pulse 1510, as shown in FIG. 15F, meaning that there is no corresponding signal sent to the output z. This result is as expected, because the logical function b XOR c should not result in an asserted output z when both b and c are asserted in the same AC clock cycle.

Figure 15G:
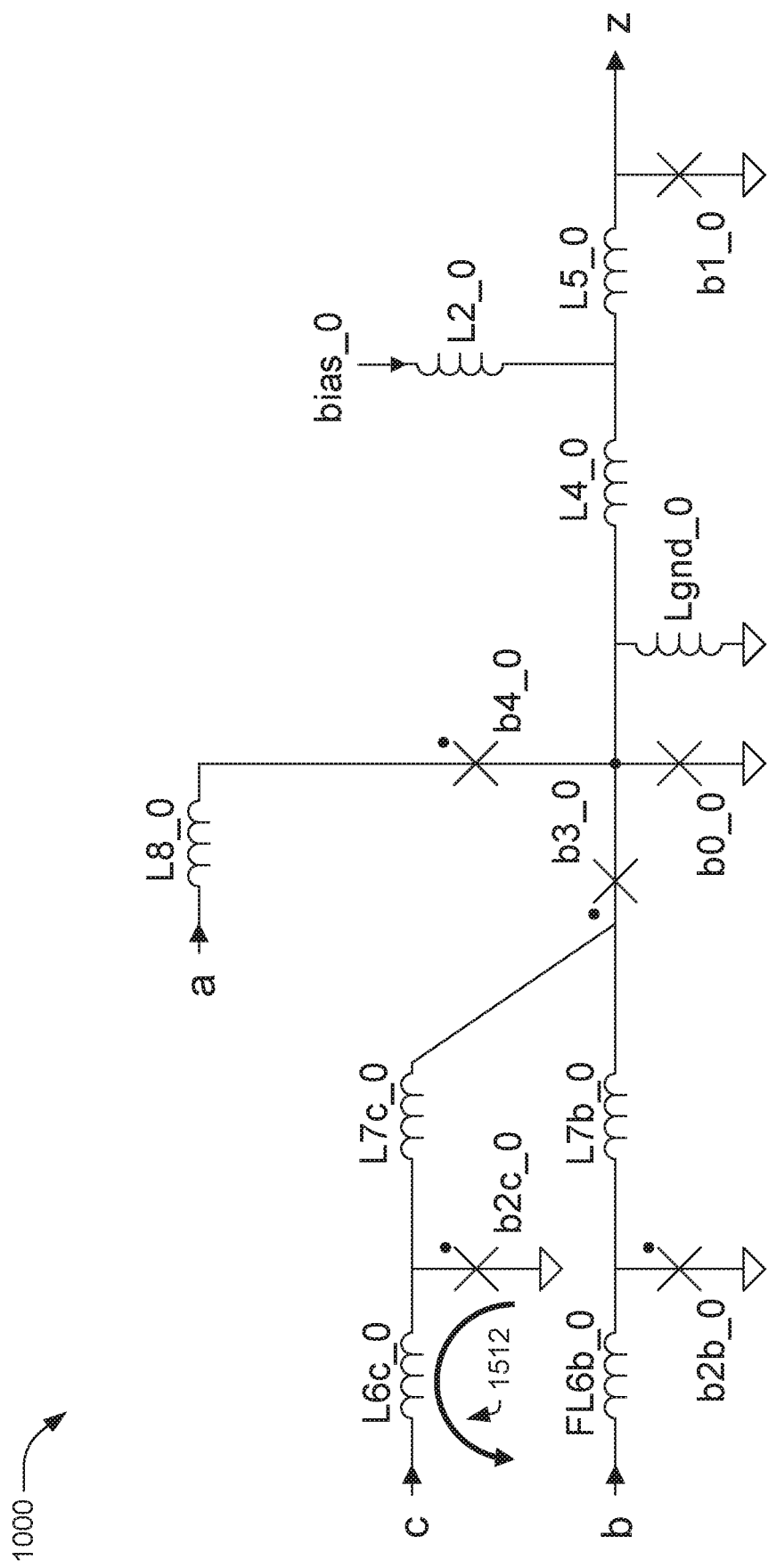
Figure 15H:
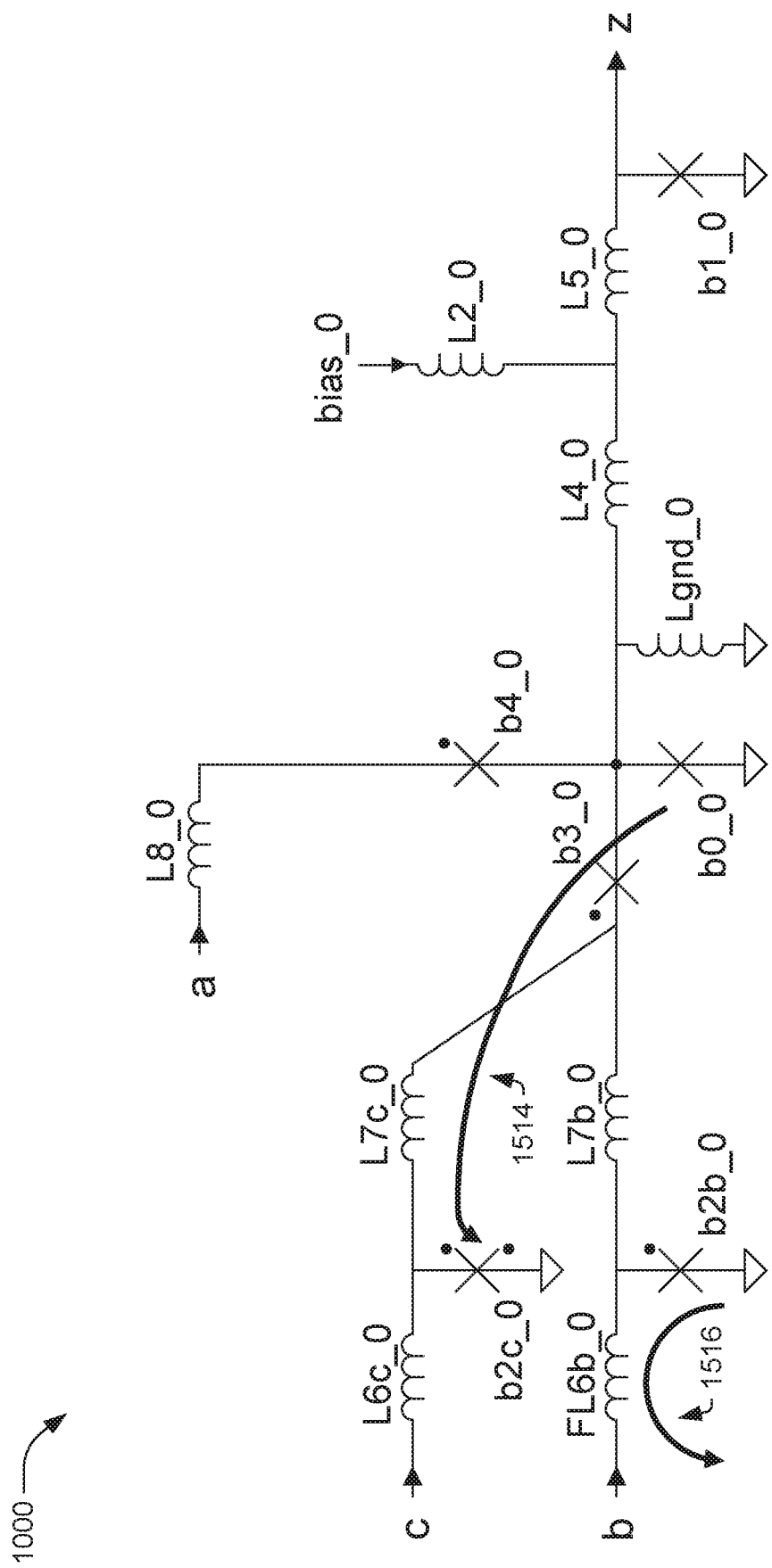
Figure 15I:
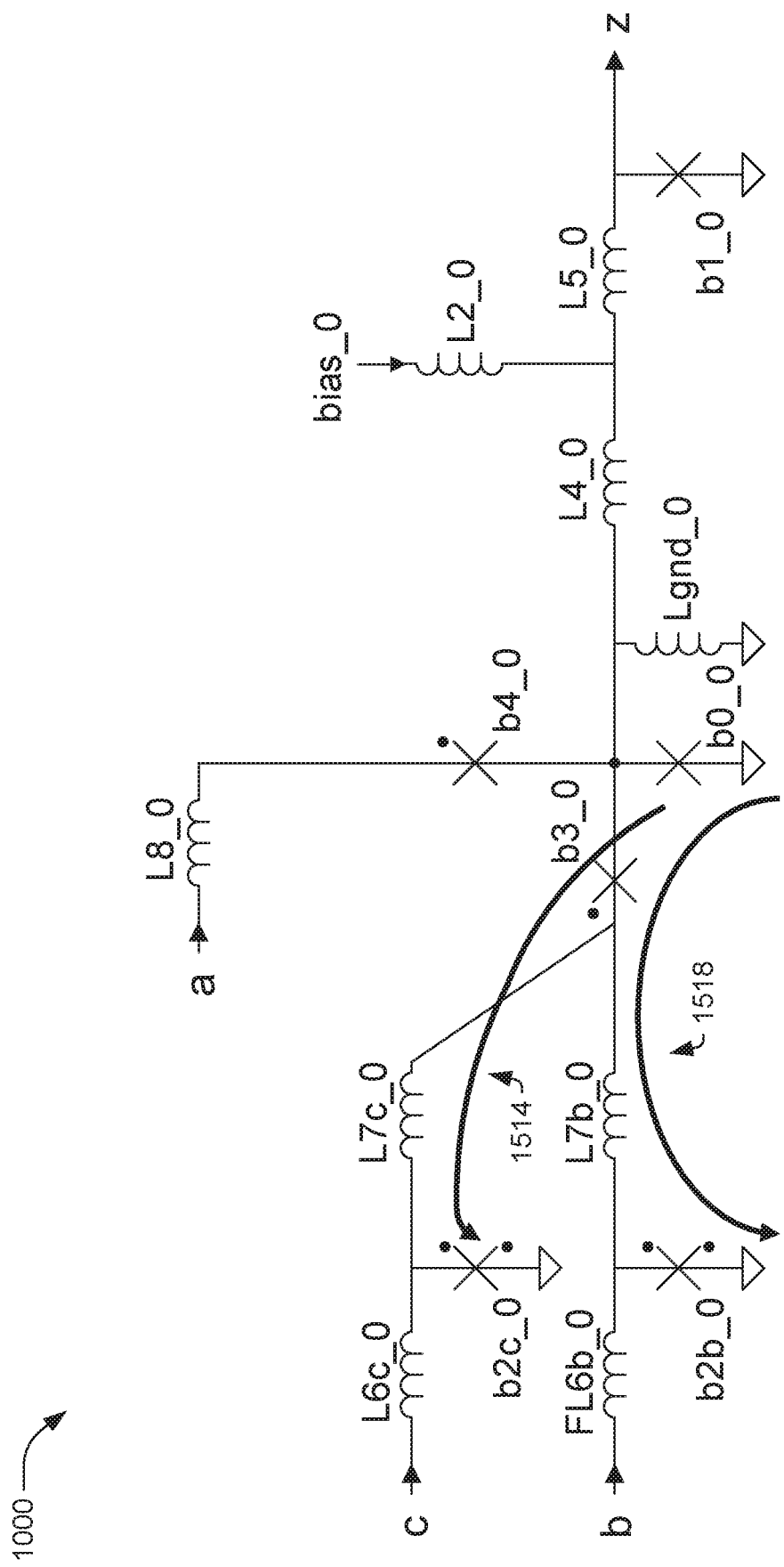
Figure 15J:
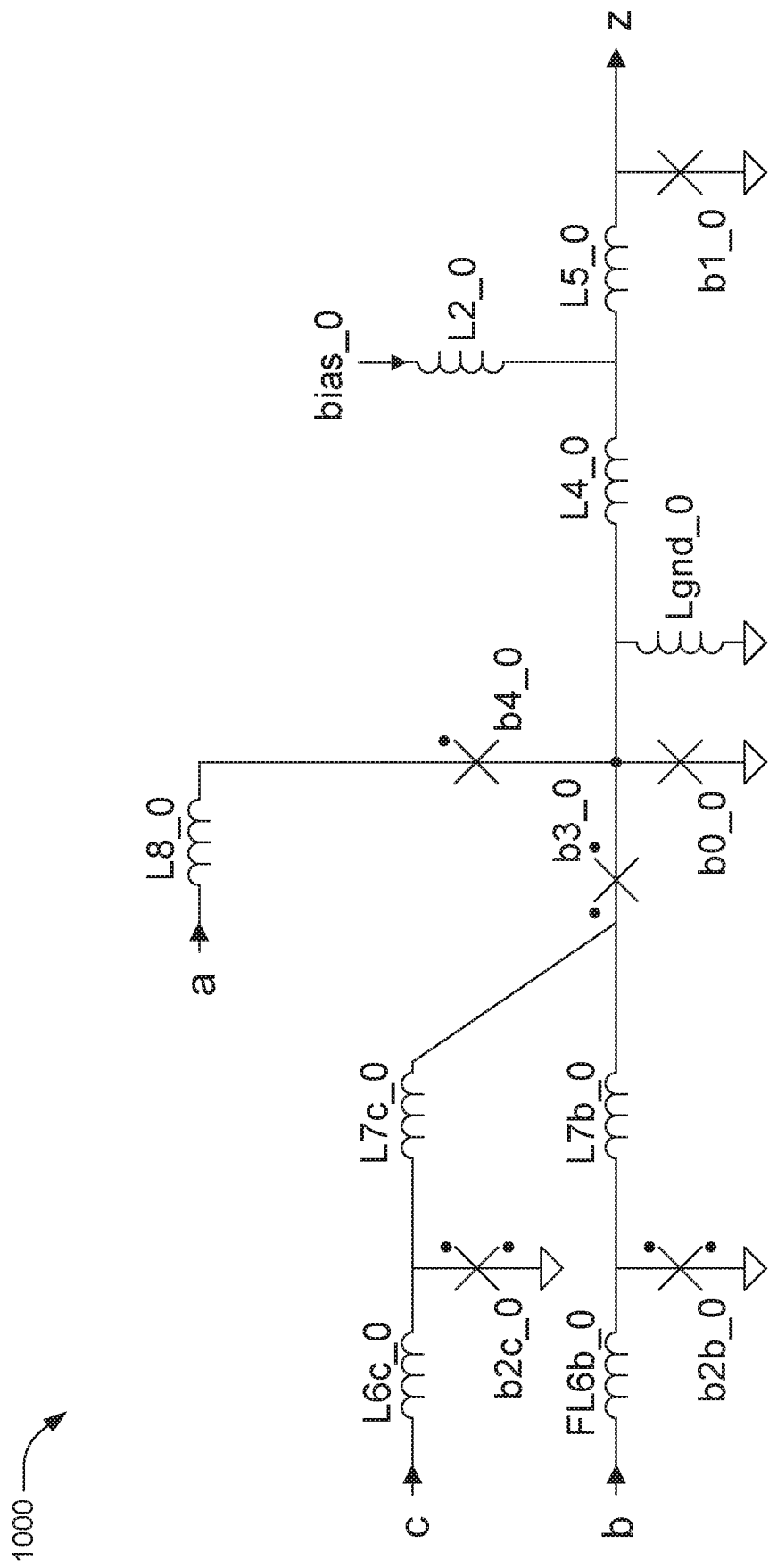

One half AC clock cycle later, the above sequence of events repeats with negative SFQ pulses to reset the gate circuit 1000 to an initial state. Thus, FIG. 15G shows a negative SFQ pulse 1512, reciprocal to the original asserting positive SFQ pulse 1502, entering circuit 1000 at first data input c. As shown in FIG. 15H, pulse 1512 causes the negative triggering ("untriggering") of first data input Josephson junction b2c_0, thereby causing the propagation of negative SFQ pulse 1512 as stored negative flux 1514 in the ground loop, netting a negative bias at logical decision Josephson junction b0_0, approximately equal to and opposite of the bias experienced by logical decision Josephson junction b0_0 when it was asserted positively under the conditions shown in FIG. 15B. FIG. 15H also shows a negative SFQ pulse 1516, reciprocal to the original asserting positive SFQ pulse 1506 from FIG. 15B, being introduced to circuit 1000 at second data input b. As before, the time ordering of the reciprocal data input pulses is arbitrary, and this pulse 1516 could also happen before or substantially simultaneous to the introduction of pulse 1512 without any change to the remainder of the operation sequence. As depicted in FIG. 15I, SFQ pulse 1516 propagates as pulse 1518, netting a negative bias at logical decision Josephson junction b0_0, approximately equal to and opposite of the bias experienced by logical decision Josephson junction b0_0 when it was asserted positively under the conditions shown in FIG. 15C. XOR-enforcing Josephson junction b3_0 untriggers, annihilating pulses 1514 and 1518, leaving circuit 1000 in the state shown in FIG. 15J, with no logical-input bias being applied to logical decision Josephson junction b0_0.

Figure 15K:
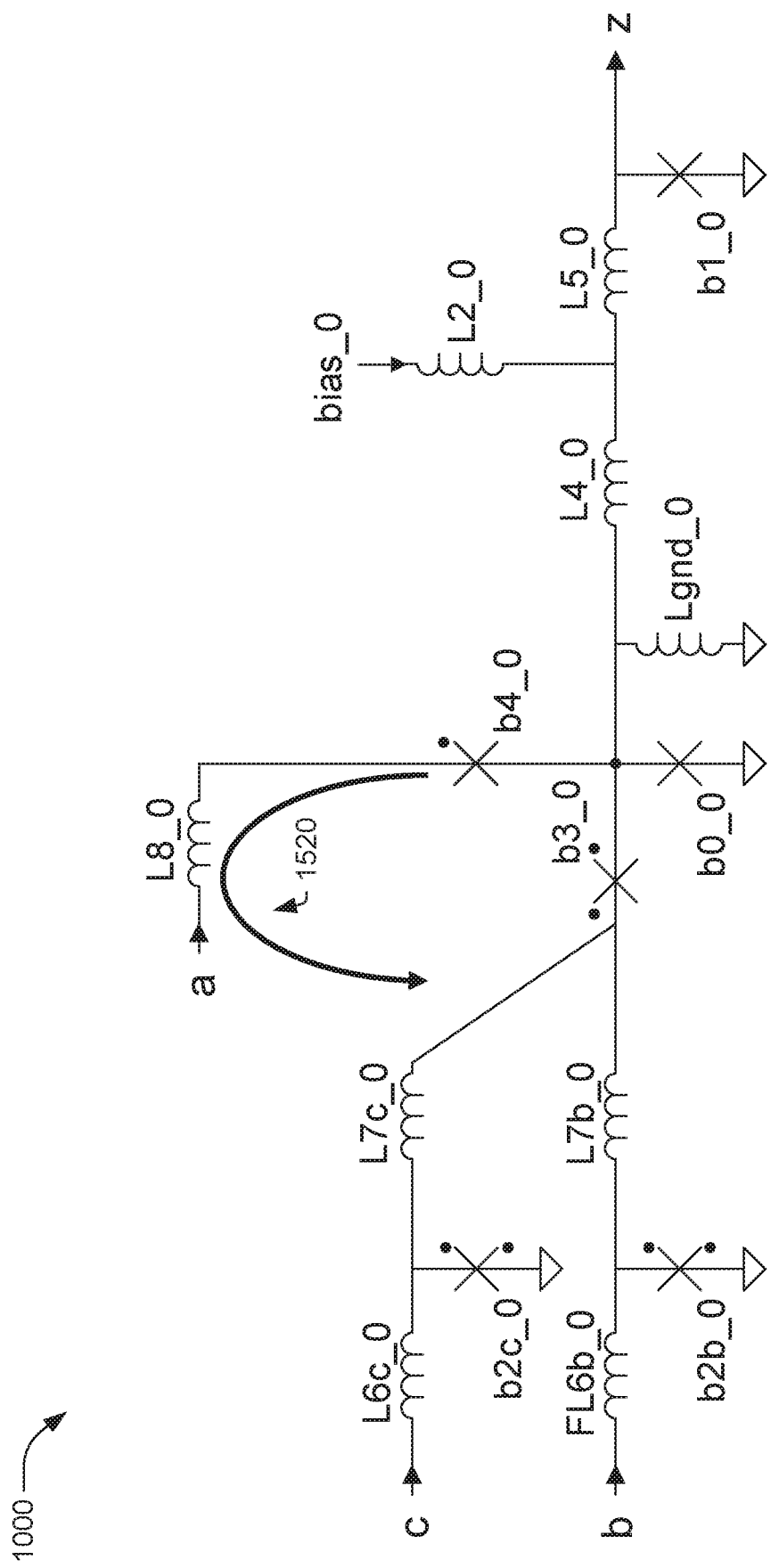
Figure 15L:
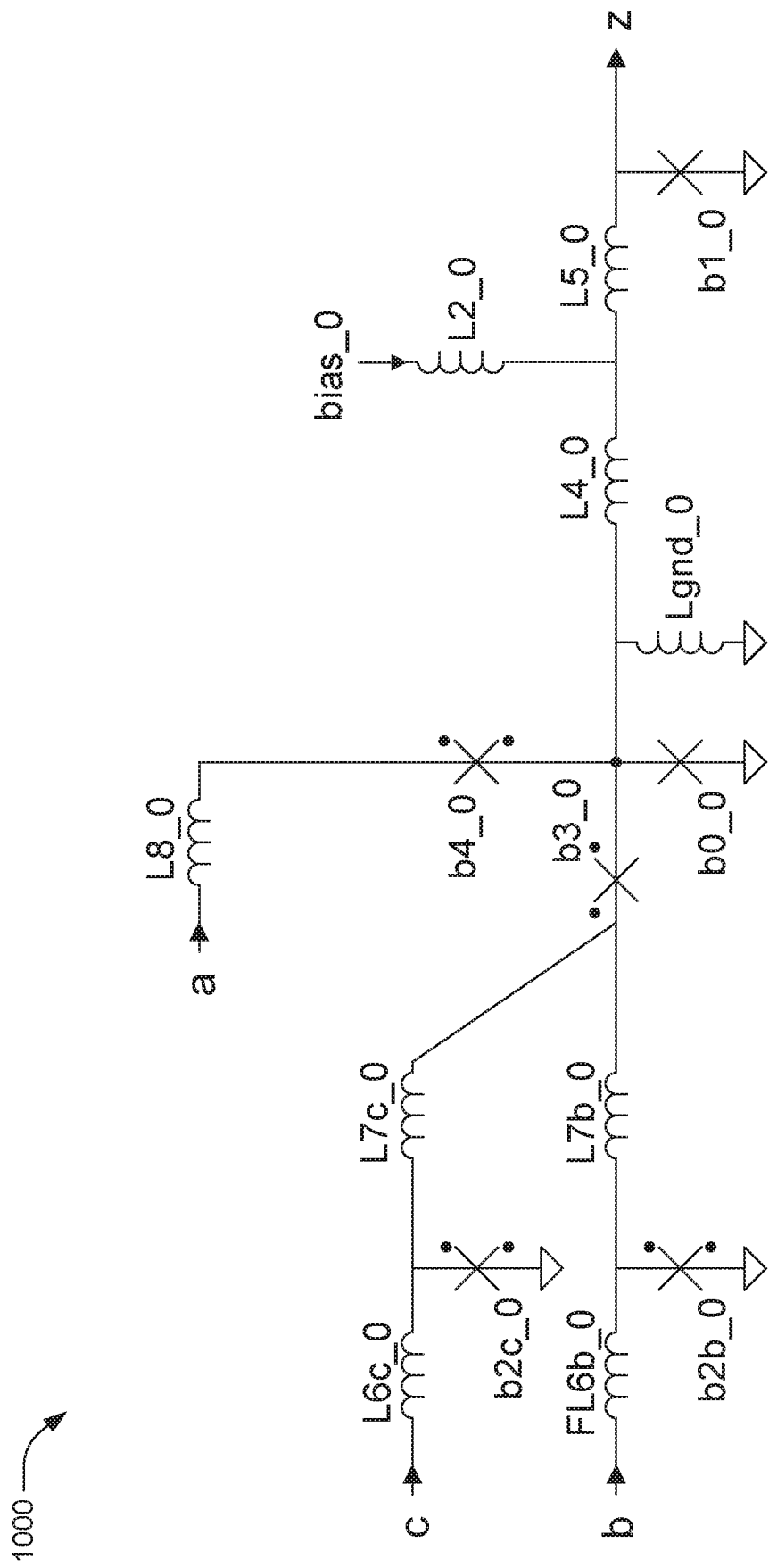

FIG. 15K illustrates the introduction of a negative SQF pulse 1520 at logical clocking input a, reciprocal to pulse 1510 shown in FIG. 15E. Because there is no extra DC biasing logical decision Josephson junction b0_0 at this point, upper Josephson junction b4_0 instead untriggers and rejects the input pulse 1520, as shown in FIG. 15L, meaning that there is no corresponding signal sent to the output z. At this point, the circuit 1000 has been reset to its initial state.

Referring back to FIG. 15E and recalling that upper Josephson junction b4_0 triggers to reject pulse 1510 to result in the state of FIG. 15F, absent upper Josephson junction b4_0, SFQ 1510 would not propagate to the output; instead, it would sit in place, circulating as shown in FIG. 15E, continuing to bias logical decision Josephson junction b0_0. At some later point with the arrival of a reciprocal negative data input pulse at either of inputs b or c, XOR-enforcing Josephson junction b3_0 would untrigger, in effect putting a positive input back in place, at which point logical decision Josephson junction b0_0 could trigger to generate a faulty output. Whether or not logical decision Josephson junction b0_0 would so trigger is dependent on the timing of events.

The introduction of upper Josephson junction b4_0 into circuit 1000 eliminates the possibility of such glitch propagation. The combination of comparator Josephson junctions b4_0 and b0_0 in effect make a decision at the moment either a positive or negative pulse is applied to input a. Either logical decision Josephson junction b0_0 will trigger and cause propagation of an output pulse, or upper Josephson junction b4_0 will trigger and reject the input applied at input a. This is in contrast to a WPL gate design such as that of circuit 500 of FIG. 5, where an input applied at input a would bias logical decision Josephson junction b0_0, and if such bias were insufficient to generate an output, nothing would happen immediately, but the biasing current would remain in place, and later events at data inputs b or c could cause logical decision Josephson junction b0_0 to trigger, propagating a glitch to the output. The inclusion of upper Josephson junction b4_0 thereby effectively converts second stage 1004 of gate circuit 1000 from a level-sensitive latch to an edge-triggered flip-flop.

Figure 16A:
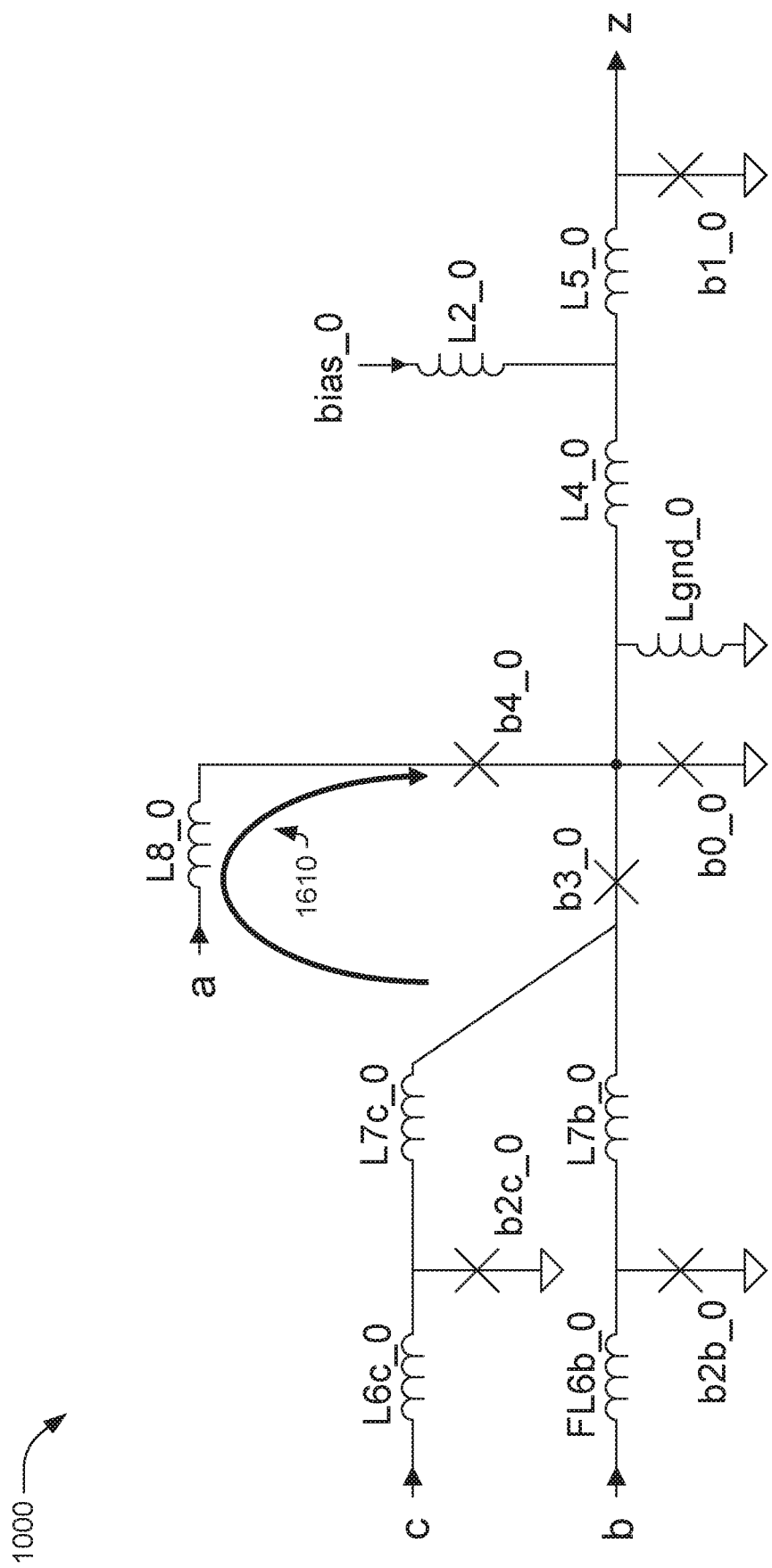
FIGS. 16A-16D illustrate yet another example sequence of operations in the gate of FIG. 10.
Figure 16B:
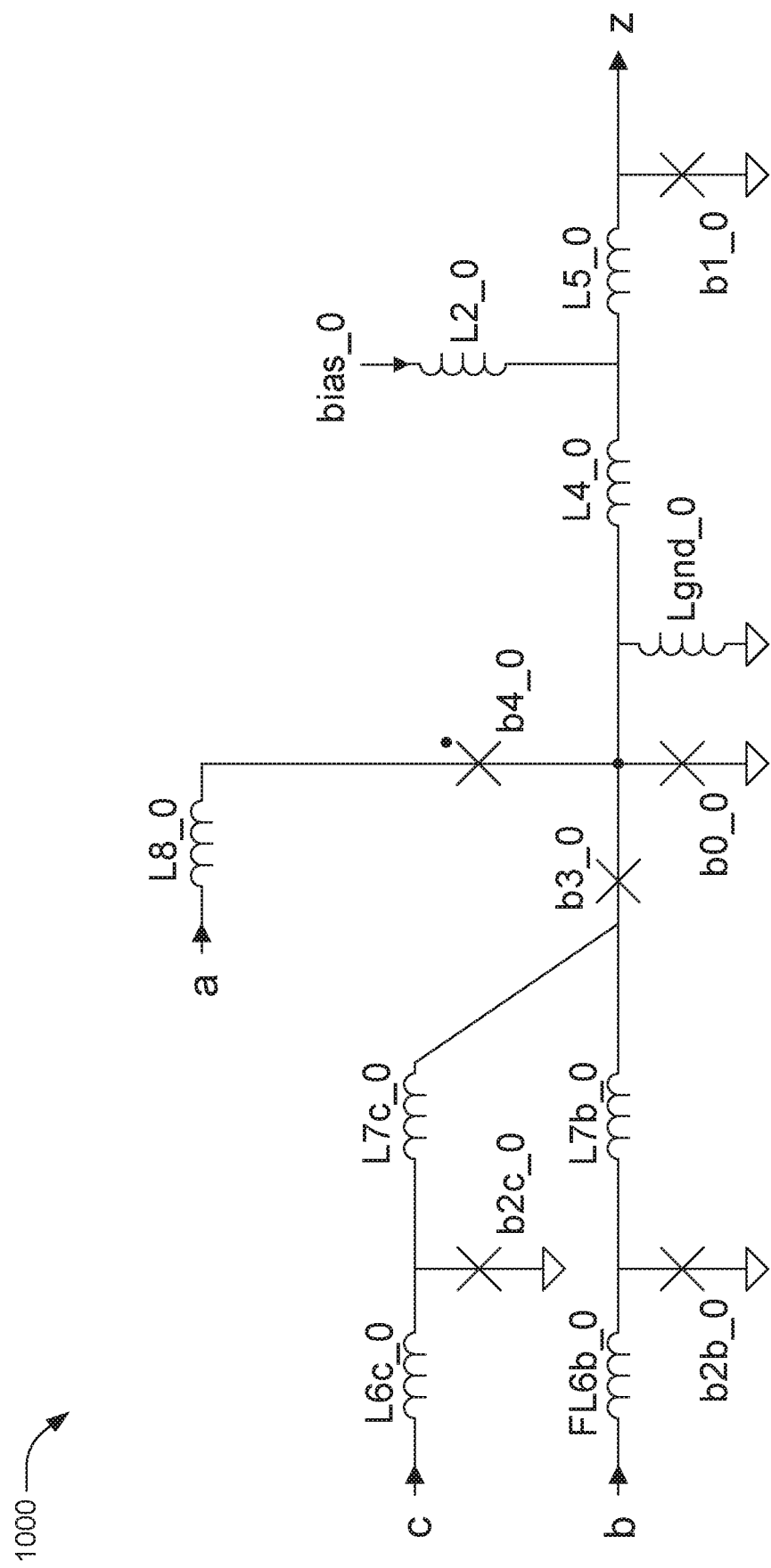
Figure 16C:
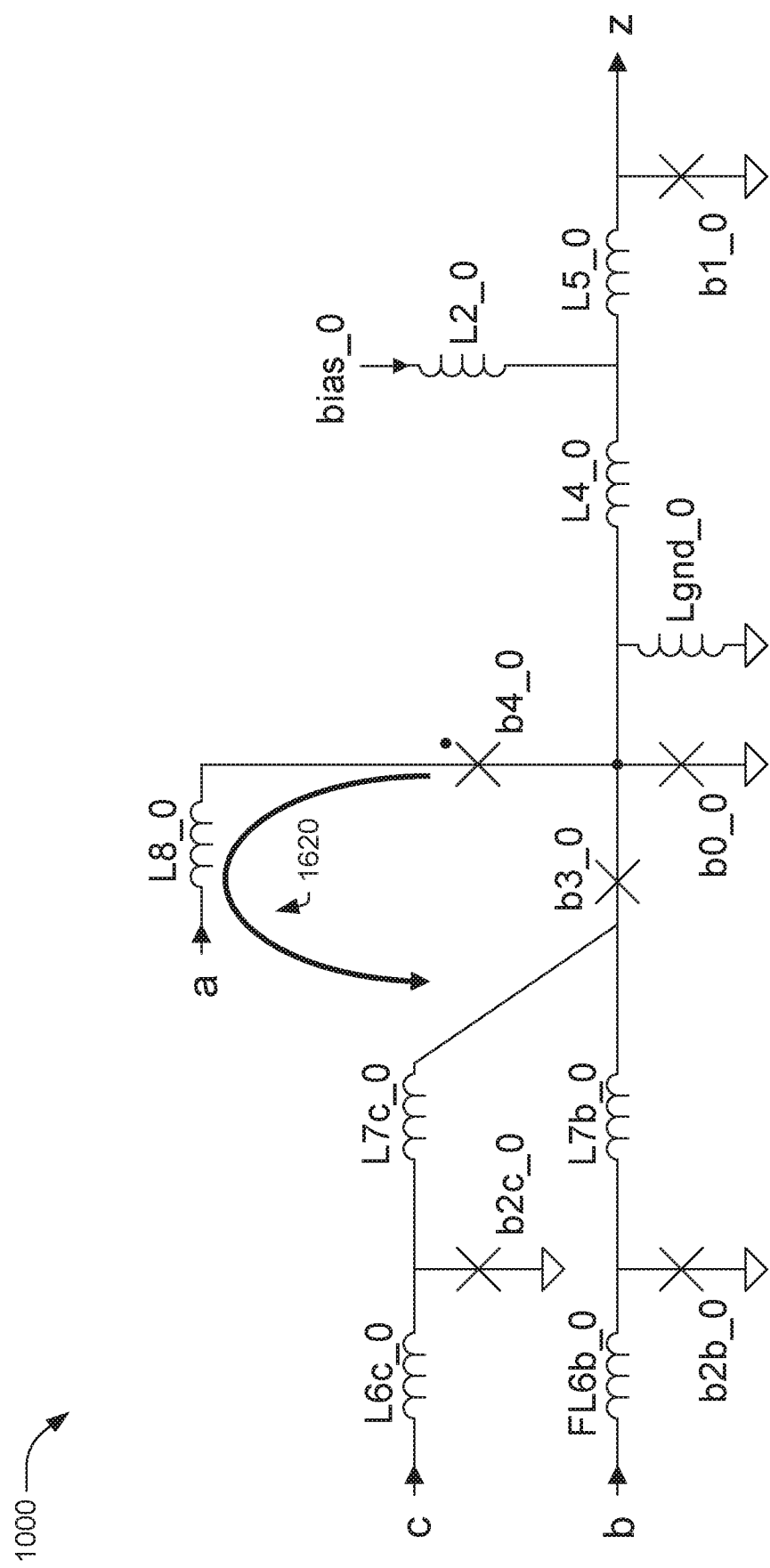
Figure 16D:
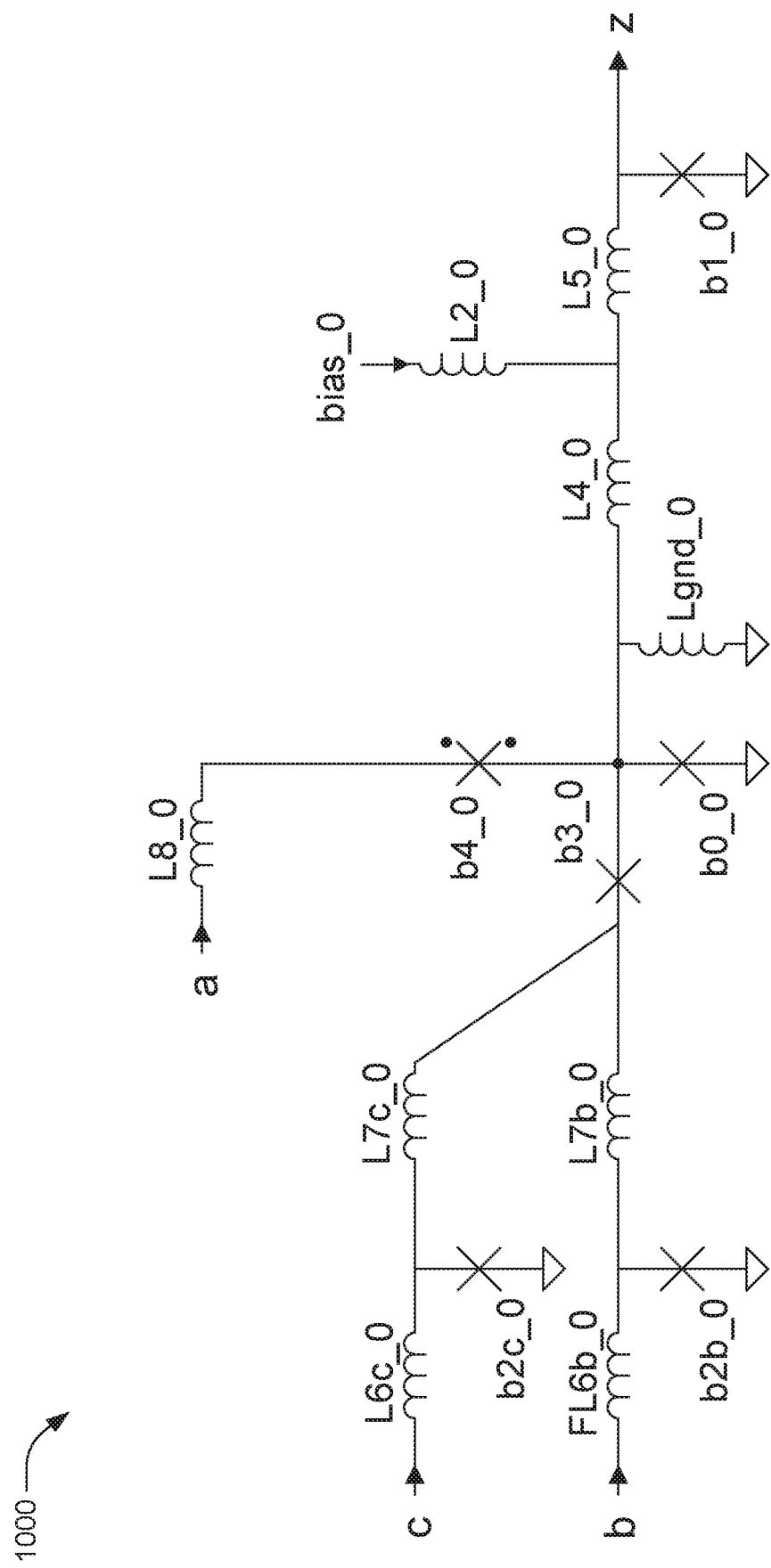

FIGS. 16A through 16D show the operation of gate circuit 1000 when only input a is asserted in a given AC clock cycle. In this scenario, like in the scenario described above with respect to FIGS. 15A through 15L, no extra DC is provided to logical decision Josephson junction b0_0, and upper Josephson junction b4_0 rejects all input pulses from input a. In FIG. 16A, logical clock SFQ pulse 1610 arrives at input a. The triggering of upper Josephson junction b4_0 rejects pulse 1610, resulting in the state shown in FIG. 16B. In FIG. 16C, negative logical clock SFQ pulse 1620, the reciprocal counterpart of pulse 1610, arrives at input a. The untriggering of upper Josephson junction b4_0 rejects pulse 1620, resulting in the state shown in FIG. 16D, in which circuit 1000 is left in its initial state.

Figure 17A:
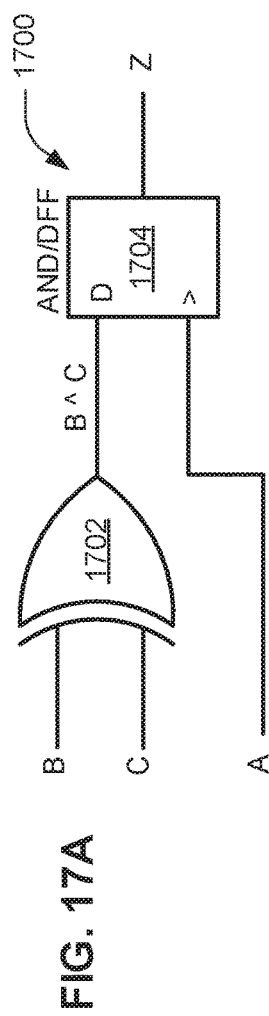
FIG. 17A is a block diagram of an RQL WPL clocked XOR gate.
Figure 17B:
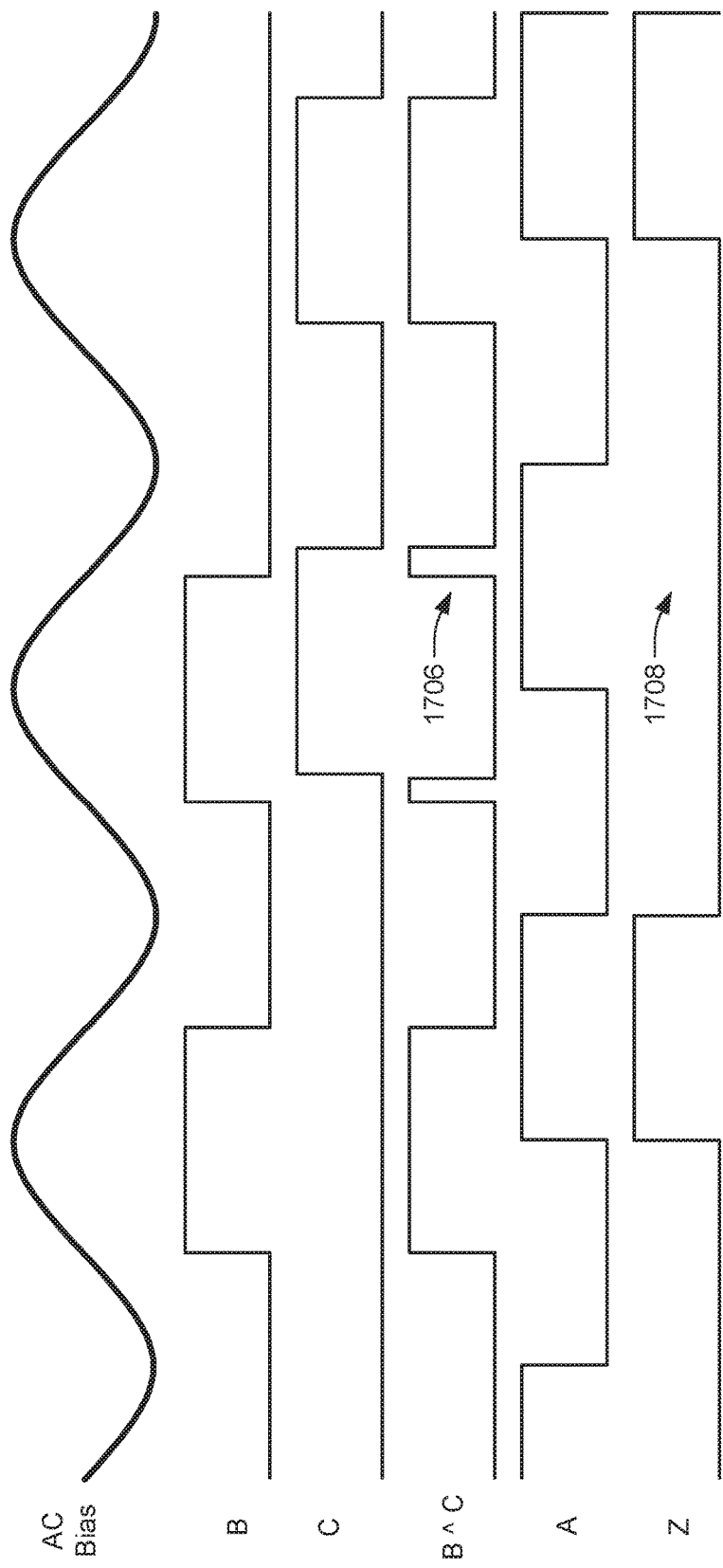
FIG. 17B is an example timing diagram for the gate of FIG. 17A.

The timing diagram of FIG. 17B provides simplified operating waveforms of the circuit 1700 illustrated in FIG. 17A, which circuit can correspond, for example, to circuit 1000 of FIG. 10, showing all inputs B, C, and A and output Z as well as the intermediate result B^C where the XOR stage 1702 (which can correspond, for example, to stage 1002 of FIG. 10) connects to the AND/DFF stage 1704 (which can correspond, for example, to stage 1004 of FIG. 10). The AND/DFF stage 1704 latches a logical "1" value (a high data input signal) on a rising edge of its clock input and latches a logical "0" value (a low data input signal) on a falling edge of its clock input, the clock input being, in the case of the example of circuit 1700, the input A, which can, for example, be enforced by logic outside of gate 1700 to be approximately 90 degrees later than data signals B and C. It can be noted by comparing FIG. 17B with FIG. 8B that glitch 1706 is not propagated to output signal at the point indicated by 1708, in the way that glitch 806 is propagated to the output as glitch 808. Thus, FIG. 17B illustrates how the edge-triggered sampling created by the b0_0/b4_0 comparator shown in FIGS. 10, 11, 12, and 13 effectively filters out any glitches that result from staggered arrival times at inputs b and c.

Figure 18:
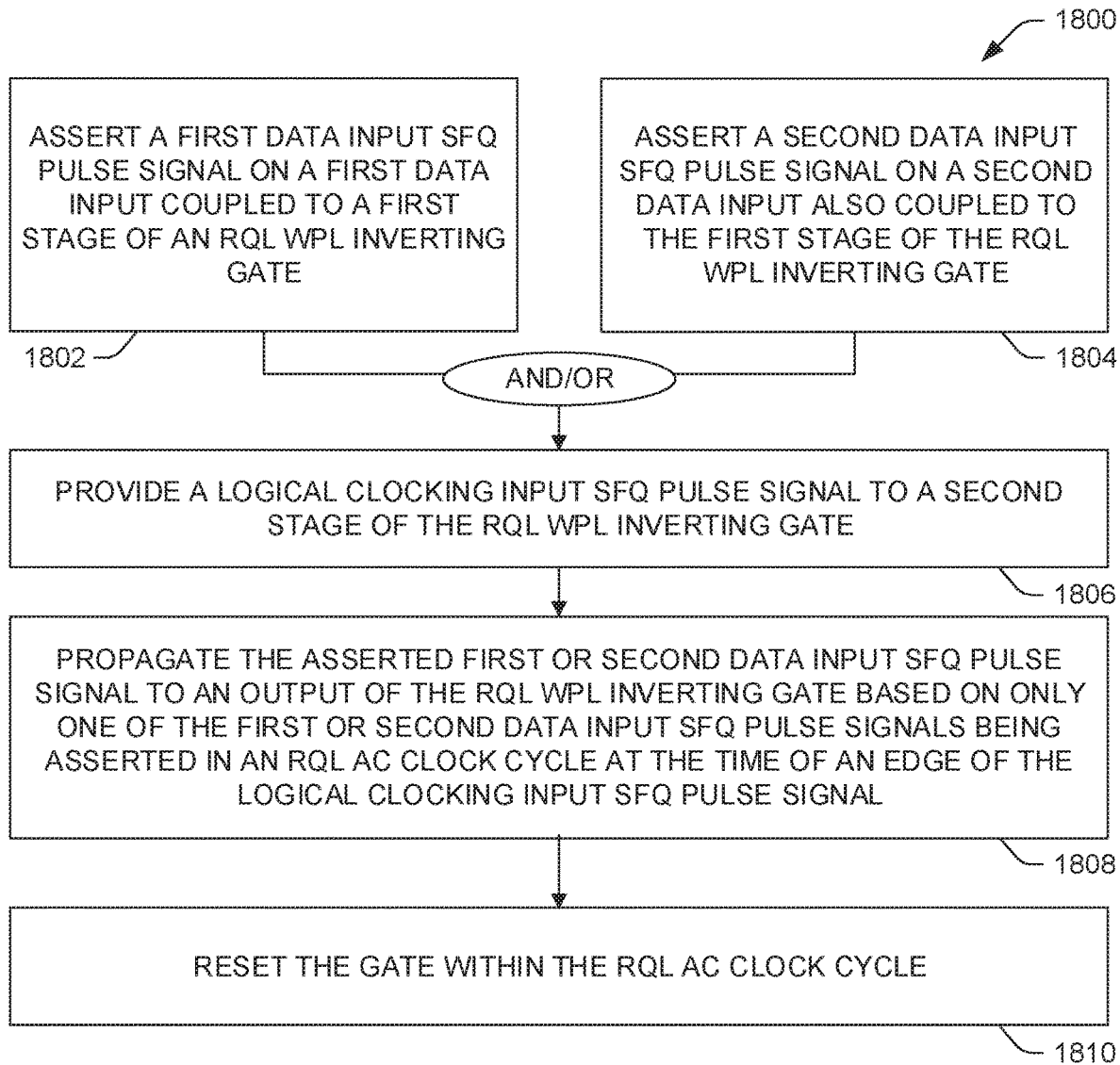
FIG. 18 is a flow diagram of an example method of operating an RQL WPL gate.

FIG. 18 is a flow diagram illustrating a method 1800 of operating an RQL WPL inverting gate. A first data input SFQ pulse signal is asserted 1802 on a first data input coupled to a first stage of an RQL WPL inverting gate, and/or a second data input SFQ pulse signal is asserted 1804 on a second data input also coupled to the first stage of the RQL WPL inverting gate. This inverting gate can be one of those depicted in FIG. 1A-1D or 10-13. A logical clocking input SFQ pulse signal is provided 1806 to a second stage of the RQL WPL inverting gate. The asserted first or second data input SFQ pulse signal is propagated 1808 to an output of the RQL WPL inverting gate based on only one of the first or second data input SFQ pulse signals being asserted in an RQL AC clock cycle at the time of an edge of the logical clocking input SFQ pulse signal. Method 1800 can further include resetting 1810 the gate within the RQL AC clock cycle, as by supplying reciprocal negative pulses at the inputs, as shown in FIG. 14F-14J, 15G-15L, or 16C-16D.

Not only do the systems and methods described herein correct the design weakness present in other RQL WPL inverting gates, they permit implementation of inverting gates that are efficient in terms of part count. For example, the circuit 1000 of FIG. 10 contains only six Josephson junctions and only nine inductors, exclusive of any parts used to supply power or biasing to the circuit 1000.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A reciprocal quantum logic (RQL) wave-pipeline logic (WPL) inverting gate comprising:
    a first stage comprising an XOR-enforcing Josephson junction, the first stage configured to receive at least two data input signals each as single flux quantum (SFQ) pulses and to process the data input signals with the XOR-enforcing Josephson junction to provide an intermediate signal;
    a second stage comprising a comparator configured to receive the intermediate signal and a clocking input signal as SFQ pulses, the second stage being configured to propagate to an output of the RQL WPL inverting gate the intermediate signal at a time of an edge of the clocking input signal.

2. The gate of claim 1, wherein the comparator comprises two Josephson junctions coupled at a joining node.

3. The gate of claim 2, wherein a first terminal of the XOR-enforcing Josephson junction is coupled to the joining node.

4. The gate of claim 3, wherein a second terminal of the XOR-enforcing Josephson junction is coupled to multiple converging inputs.

5. The gate of claim 1, wherein the second stage further comprises an output amplifying Josephson transmission line (JTL).

6. An RQL WPL A AND (B XOR C) gate comprising the gate of claim 1.

7. An RQL WPL XOR gate comprising the gate of claim 1 and a pulse generator coupled to a clocking input of the gate of claim 1 to provide the clocking input signal as a single reciprocal SFQ pulse pair with each RQL AC clock cycle.

8. An RQL WPL NOT gate comprising:
    the gate of claim 1;
    a first pulse generator coupled to a clocking input of the gate of claim 1 to provide the clocking input signal as a single reciprocal SFQ pulse pair with each RQL AC clock cycle; and
    a second pulse generator coupled to a data input of the gate of claim 1 to provide one of the at least two data input signals as a single reciprocal SFQ pulse pair with each RQL AC clock cycle.

9. An RQL WPL A-AND-NOT-B gate comprising the gate of claim 1 and a pulse generator coupled to a data input of the gate of claim 1 to provide one of the at least two data input signals as a single reciprocal SFQ pulse pair with each RQL AC clock cycle.

10. A method of operating a reciprocal quantum logic (RQL) wave-pipeline logic (WPL) inverting gate, the method comprising:
    asserting a first data input single flux quantum (SFQ) pulse signal on a first data input coupled to a first stage of an RQL WPL inverting gate, and/or asserting a second data input SFQ pulse signal on a second data input also coupled to the first stage of the RQL WPL inverting gate;
    providing a logical clocking input SFQ pulse signal to a second stage of the RQL WPL inverting gate;
    wherein the asserted first or second data input SFQ pulse signal is propagated to an output of the RQL WPL inverting gate based on only one of the first or second data input SFQ pulse signals being asserted in an RQL AC clock cycle at a time of an edge of the logical clocking input SFQ pulse signal.

11. The method of claim 10, further comprising resetting the RQL WPL inverting gate within the RQL AC clock cycle.

12. The method of claim 10, wherein the RQL WPL inverting gate functions as an A AND (B XOR C) gate to logically AND the logical clocking input SFQ pulse signal with the exclusive-OR of the first and second data input SFQ pulse signals.

13. The method of claim 10, wherein the logical clocking input SFQ pulse signal is provided by a pulse generator, such that the RQL WPL inverting gate functions as an XOR gate to exclusive-OR the first and second data input SFQ pulse signals.

14. The method of claim 10, wherein the first data input SFQ pulse signal is provided by a first pulse generator, and the logical clocking input SFQ pulse signal is provided by a second pulse generator, such that the RQL WPL inverting gate functions as a NOT gate to logically invert the second data input SFQ pulse signal.

15. The method of claim 10, wherein the first data input SFQ pulse signal is provided by a pulse generator, such that the RQL WPL inverting gate functions as an A-AND-NOT-B gate to logically AND the logical clocking input SFQ pulse signal with the logical inverse of the second data input SFQ pulse signal.

16. A reciprocal quantum logic (RQL) wave-pipeline logic (WPL) circuit comprising:
first and second data signal inputs to a first node;
a logical clock signal input to a second node;
a first Josephson junction (JJ), a first terminal of the first JJ coupled to the first node and a second terminal of the first JJ coupled to a third node, the first JJ being configured to provide exclusive-OR functionality with respect to data input signals provided on the first and second data signal inputs;
a second JJ, a first terminal of the second JJ coupled to the third node and a second terminal of the second JJ coupled to ground;
a third JJ, a first terminal of the third JJ coupled to the second node and a second terminal of the third JJ coupled to the third node, the second and third JJs forming a comparator;
a ground inductor, a first terminal of the ground inductor coupled to the third node and a second terminal of the ground inductor coupled to ground; and
an output.

17. The circuit of claim 16, further comprising an output amplifying Josephson transmission line coupled between the third node and the output.

18. The circuit of claim 16, further comprising a pulse generator coupled to the logical clock signal input, such that the circuit behaves as an XOR gate.

19. The circuit of claim 16, further comprising a first pulse generator coupled to the logical clock signal input and a second pulse generator coupled to the first data signal input, such that the circuit behaves as a NOT gate to provide at the output an output signal that is the logical inverse of a data input signal provided to the second data signal input.

20. The circuit of claim 16, further comprising a pulse generator coupled to the first data signal input, such that the circuit behaves as an A-AND-NOT-B gate to provide at the output an output signal that is the logical AND of a first input signal provided to the logical clock signal input and the logical inverse of a second input signal provided to the second data signal input.

* * * * *